US009035402B2

United States Patent
Asao et al.

(10) Patent No.: US 9,035,402 B2
(45) Date of Patent: May 19, 2015

(54) SEMICONDUCTOR MEMORY DEVICE

(71) Applicants: Yoshiaki Asao, Yokkaichi (JP); Hideaki Harakawa, Seongnam-si (KR)

(72) Inventors: Yoshiaki Asao, Yokkaichi (JP); Hideaki Harakawa, Seongnam-si (KR)

(*) Notice: Subject to any disclaimer, the term of this patent is extended or adjusted under 35 U.S.C. 154(b) by 106 days.

(21) Appl. No.: 13/963,710

(22) Filed: Aug. 9, 2013

(65) Prior Publication Data
US 2014/0284533 A1 Sep. 25, 2014

Related U.S. Application Data

(60) Provisional application No. 61/804,569, filed on Mar. 22, 2013.

(51) Int. Cl.
*H01L 43/08* (2006.01)
*H01L 27/22* (2006.01)
*G11C 11/16* (2006.01)

(52) U.S. Cl.
CPC .............. *H01L 27/228* (2013.01); *H01L 43/08* (2013.01); *G11C 11/165* (2013.01)

(58) Field of Classification Search
CPC .... H01L 45/05; H01L 27/228; G11C 11/165; G11C 11/1655; G11C 11/1657; G11C 11/1659
USPC .................. 257/421, 427, E43.004, E27.005; 365/158, 171, 173
See application file for complete search history.

(56) References Cited

U.S. PATENT DOCUMENTS

| 6,847,073 | B2 * | 1/2005 | Kanaya ......................... 257/295 |
| 8,116,128 | B2 * | 2/2012 | Takemura et al. ............. 365/163 |
| 8,503,216 | B2 * | 8/2013 | Kajiyama ..................... 365/148 |
| 8,779,496 | B2 * | 7/2014 | Saito et al. .................... 257/314 |
| 2010/0301480 | A1 | 12/2010 | Choi et al. | |
| 2011/0012179 | A1 | 1/2011 | Kajiyama | |

(Continued)

FOREIGN PATENT DOCUMENTS

JP 2010-287815 A 12/2010

OTHER PUBLICATIONS

M. Hosomi, et al.: "A Novel Nonvolatile Memory with Spin Torque Transfer Magnetization Switching: Spin-RAM", IEEE 2005 Technical Digest, Four Pages (in English).

(Continued)

*Primary Examiner* — Allison P Bernstein
(74) *Attorney, Agent, or Firm* — Holtz Holtz Goodman & Chick PC

(57) ABSTRACT

According to one embodiment, a semiconductor memory device comprises a cell transistor includes a first gate electrode buried in a semiconductor substrate and a first diffusion layer and a second diffusion layer formed to sandwich the first gate electrode, a first lower electrode formed on the first diffusion layer, a magnetoresistive element formed on the first lower electrode to store data according to a change in a magnetization state and connected to a bit line located above, a second lower electrode formed on the second diffusion layer, and a first contact formed on the second lower electrode and connected to a source line located above. A contact area between the second lower electrode and the second diffusion layer is larger than a contact area between the first contact and the second lower electrode.

20 Claims, 18 Drawing Sheets

(56) References Cited

U.S. PATENT DOCUMENTS

| | | |
|---|---|---|
| 2011/0037108 A1 | 2/2011 | Sugiura et al. |
| 2011/0069534 A1 | 3/2011 | Inaba |
| 2011/0249485 A1 | 10/2011 | Fujita et al. |
| 2011/0254112 A1* | 10/2011 | Yamanaka et al. ............ 257/421 |
| 2011/0266600 A1* | 11/2011 | Kanaya et al. ................ 257/295 |
| 2014/0284738 A1* | 9/2014 | Nakazawa et al. ............ 257/421 |

OTHER PUBLICATIONS

J.C. Slonczewski, "Current-driven excitation of magnetic multilayers", Journal of Magnetism and Magnetic Materials 159 (1996), L1-L7 (in English).

* cited by examiner

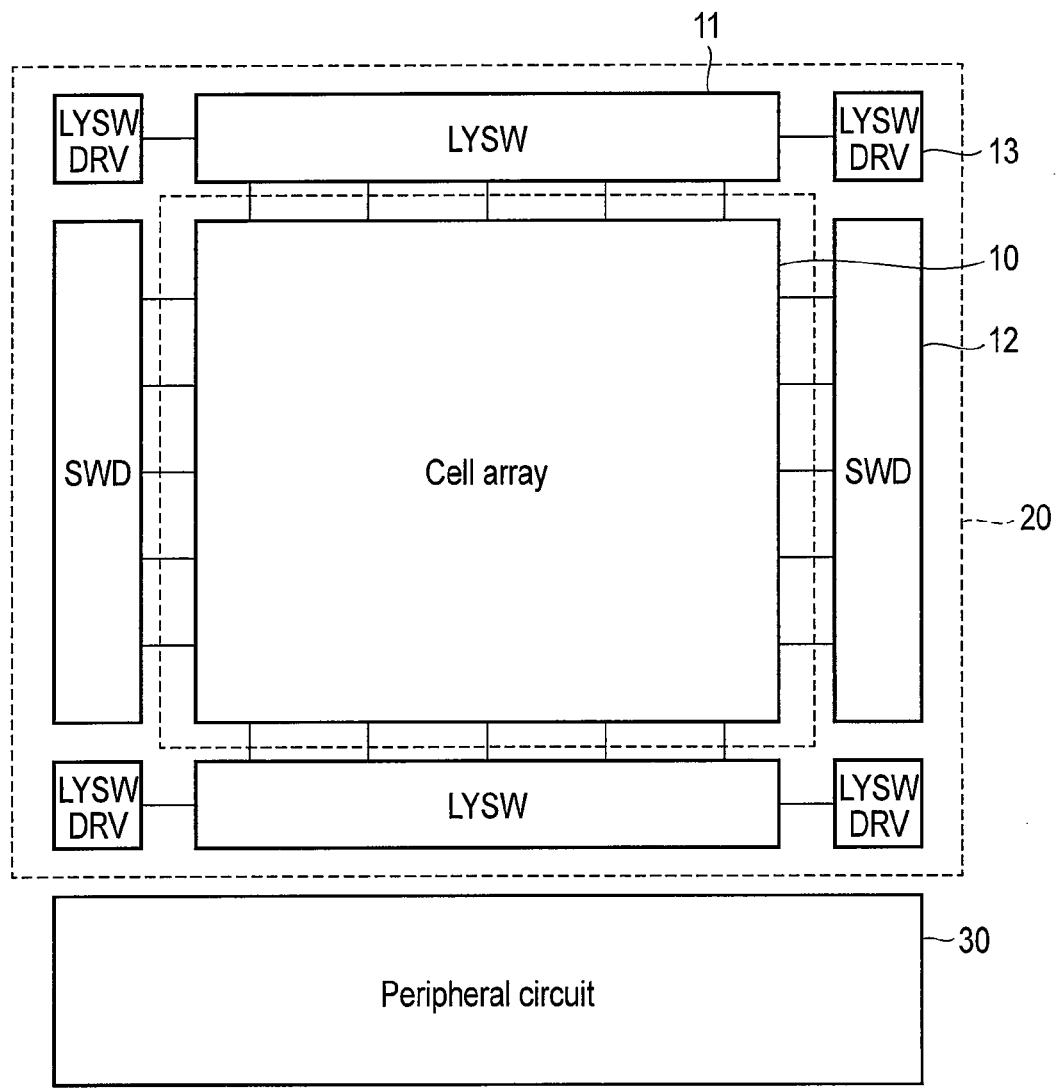
F I G. 1

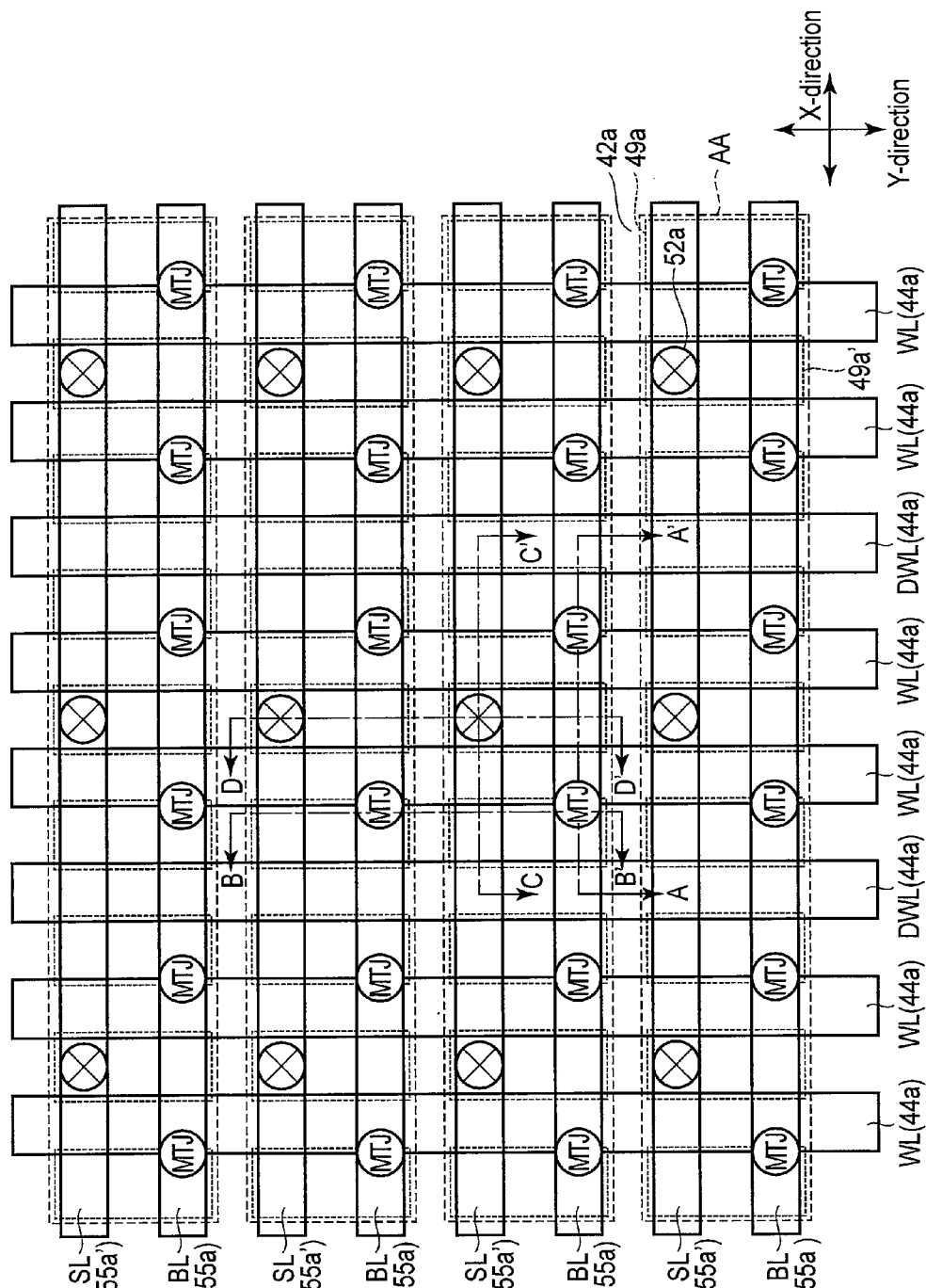
F I G. 2

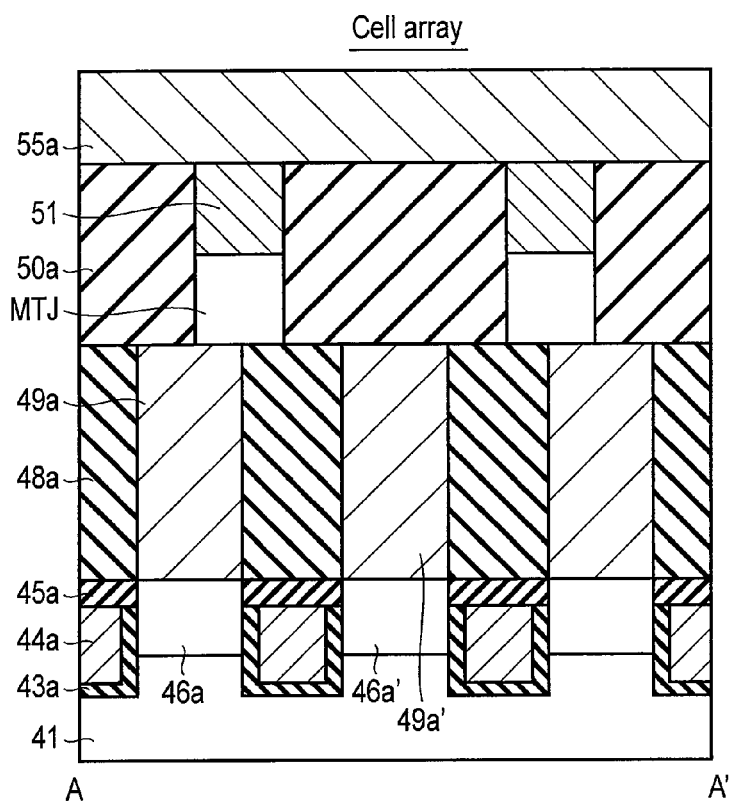
F I G. 3
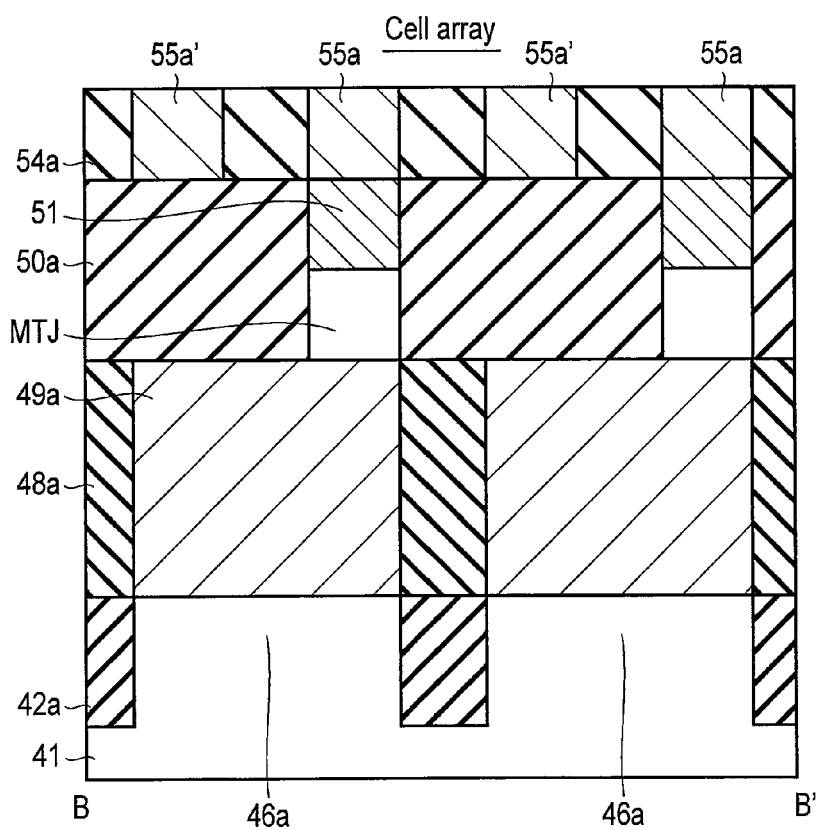
F I G. 4

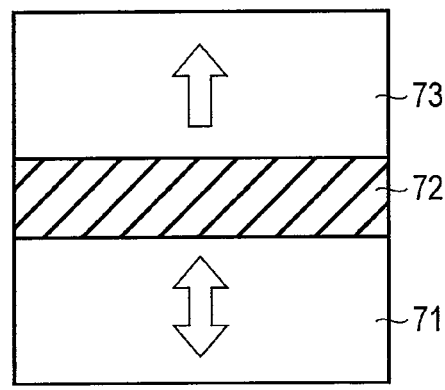
FIG. 7A
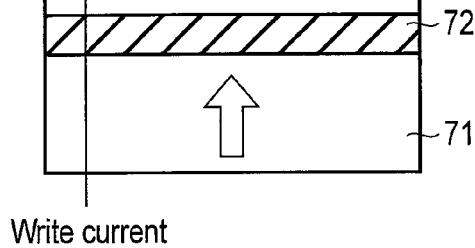
FIG. 7B   Parallel state (low resistance)
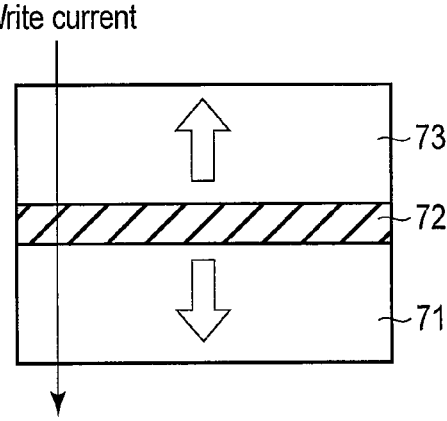
FIG. 7C   Anti-parallel state (high resistance)

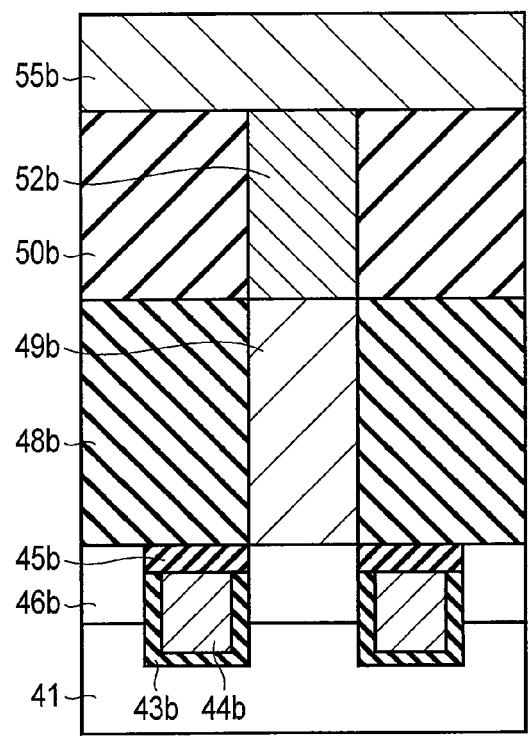
F I G. 10
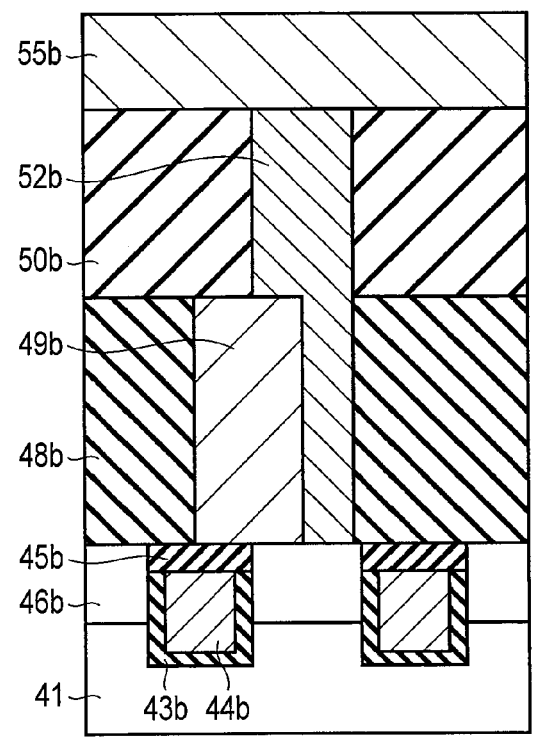
F I G. 11

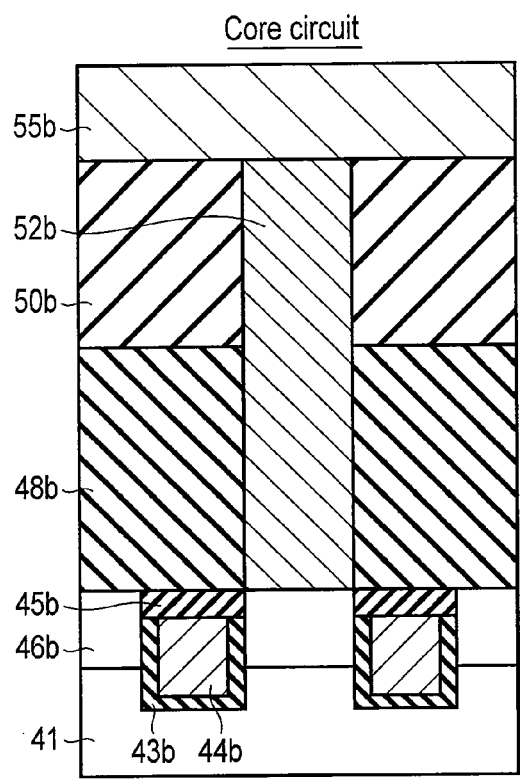
F I G. 1 2
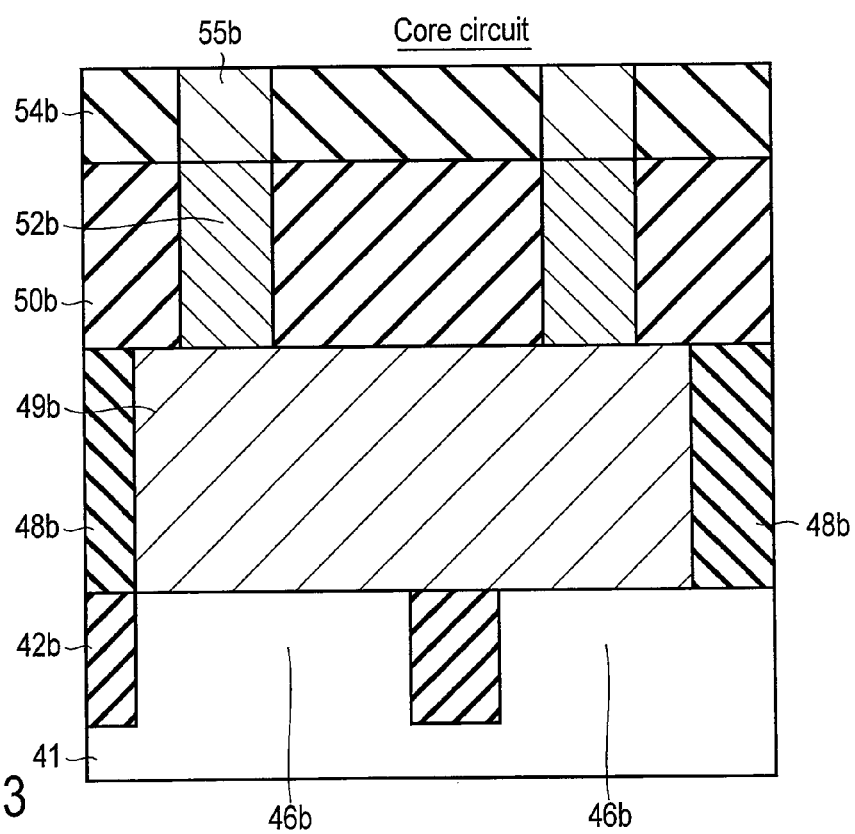
F I G. 1 3

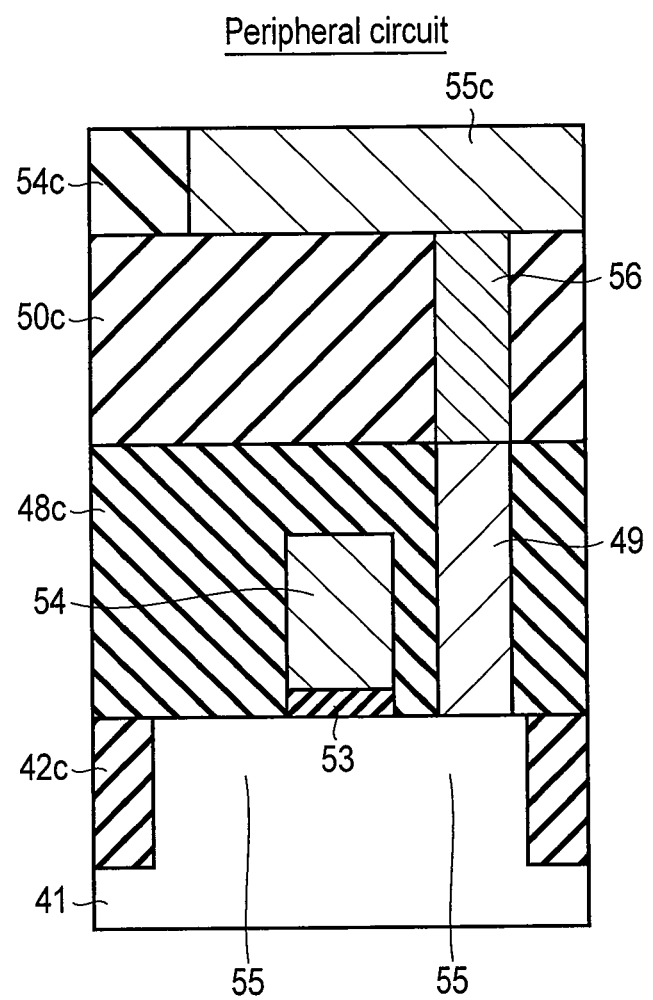
F I G. 14

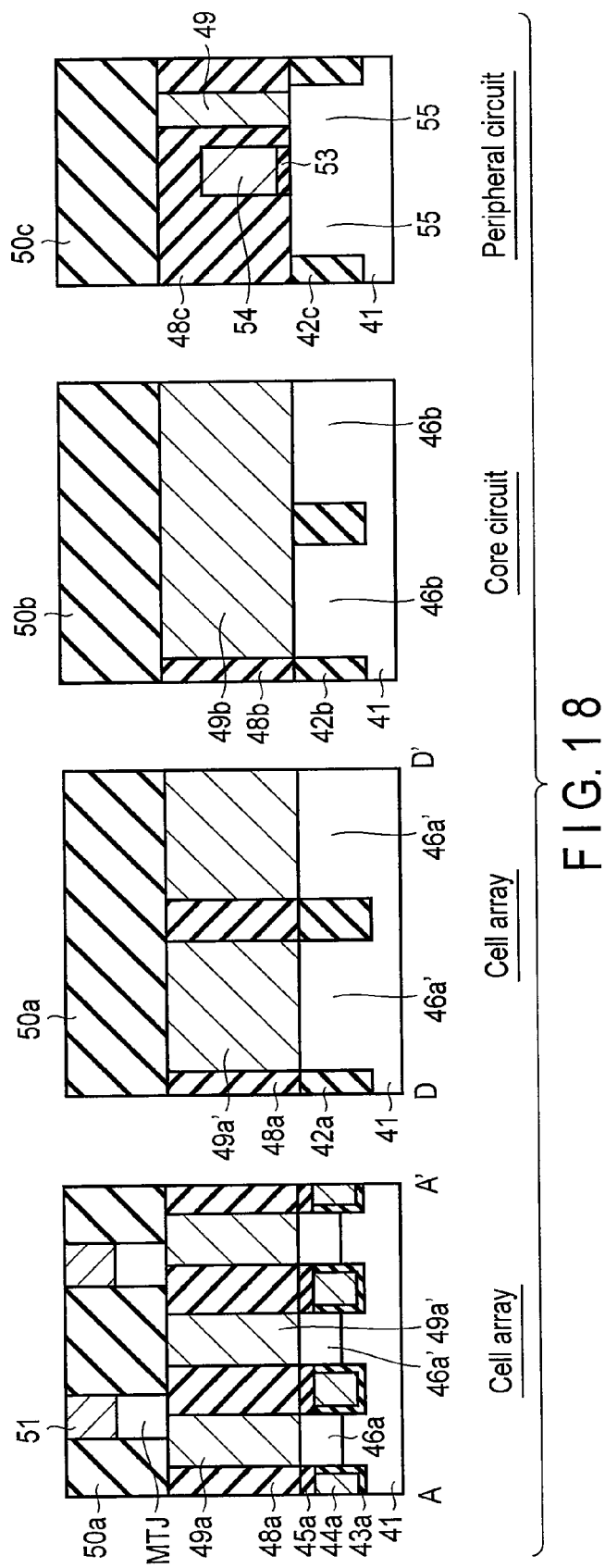
F I G. 18

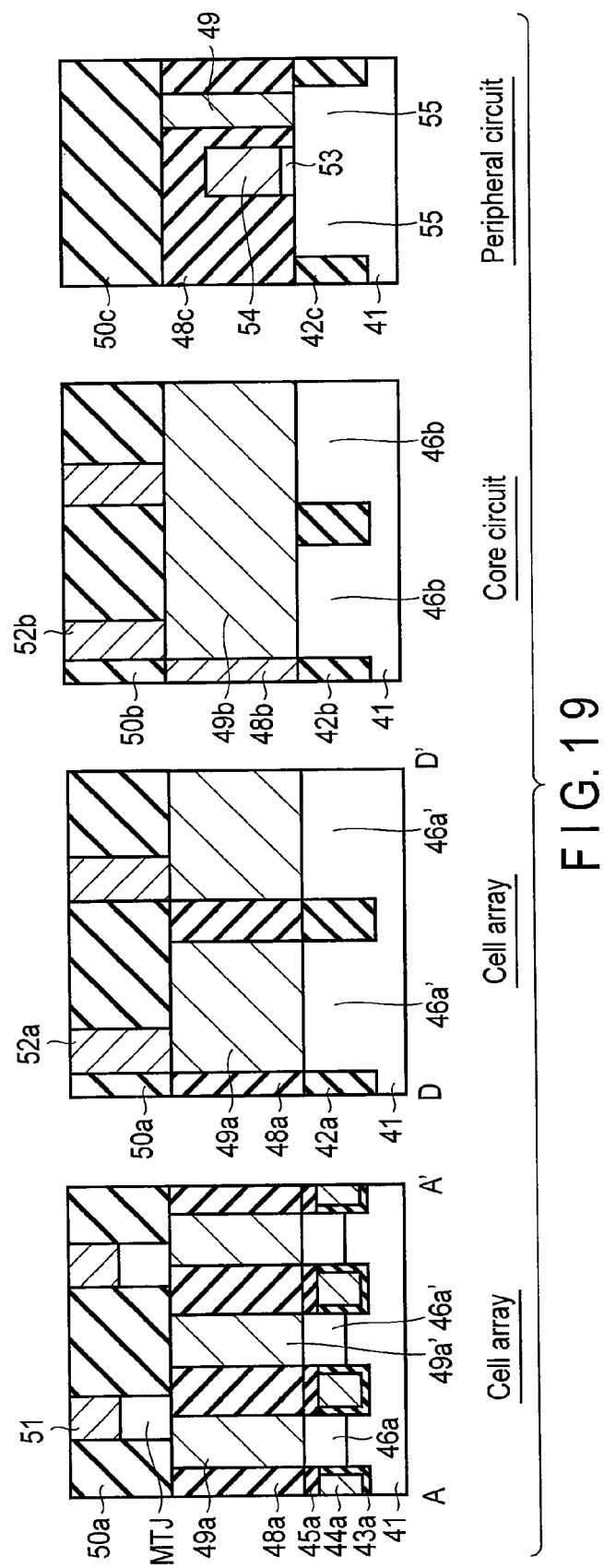
F I G. 19

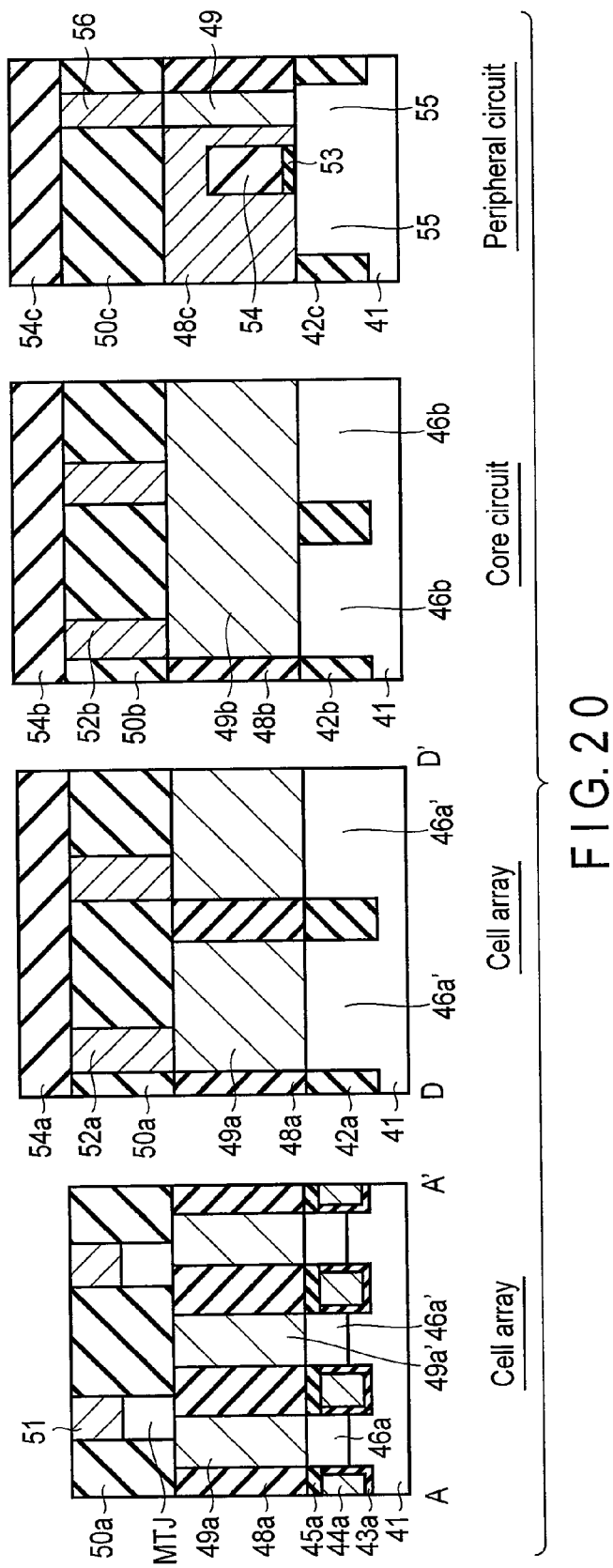
F I G. 20

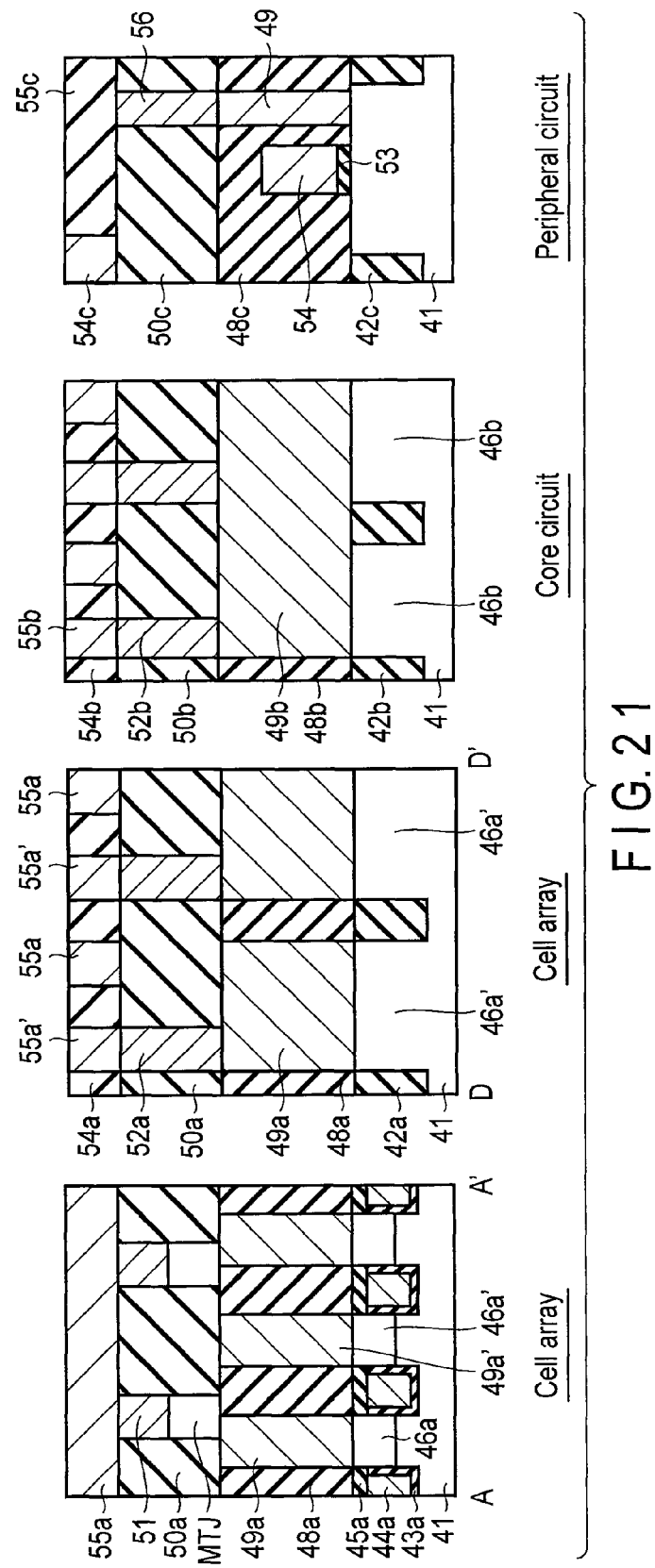
F I G. 21

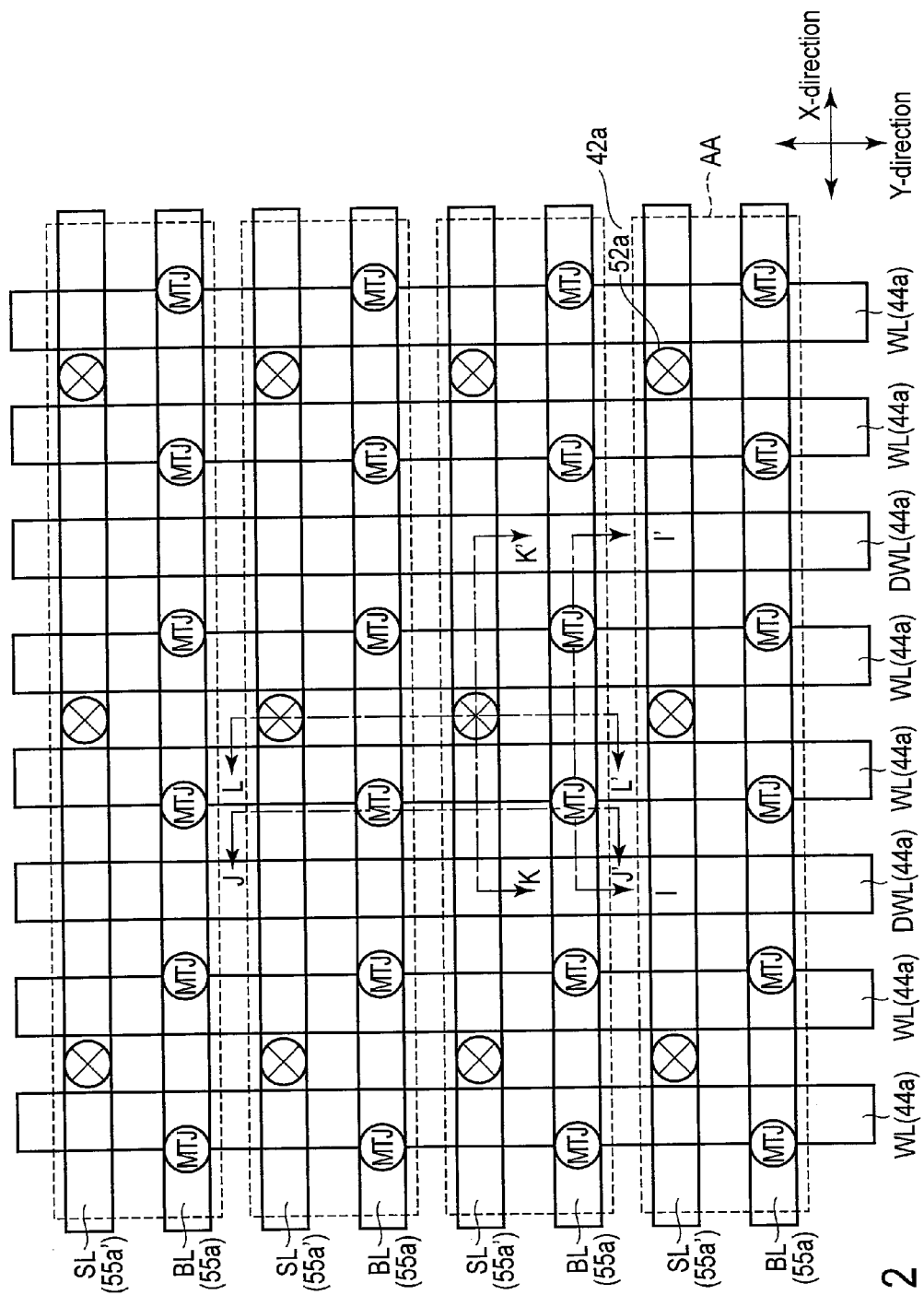
F I G. 22

US 9,035,402 B2

SEMICONDUCTOR MEMORY DEVICE

CROSS-REFERENCE TO RELATED APPLICATIONS

This application claims the benefit of U.S. Provisional Application No. 61/804,569, filed Mar. 22, 2013, the entire contents of which are incorporated herein by reference.

FIELD

Embodiments described herein relate generally to a semiconductor memory device.

BACKGROUND

As a semiconductor memory that stores information in accordance with a new principle, a spin transfer magnetic random access memory (MRAM) has recently been proposed. The MRAM comprises magnetic tunnel junction (MTJ) elements serving as memory cells. The memory cell comprises two magnetic layers (ferromagnetic layers) and a nonmagnetic layer formed between the magnetic layers. The MTJ element stores binary 1 or 0 depending on whether the magnetization states of the two magnetic layers, that is, the directions of spins in the two magnetic layers, are parallel or anti-parallel to each other.

BRIEF DESCRIPTION OF THE DRAWINGS

FIG. 1 is a block diagram showing a general configuration of an MRAM according to the present embodiment;

FIG. 2 is a plan view showing a cell array in the MRAM according to the present embodiment;

FIG. 3 is a cross-sectional view taken along line A-A' in FIG. 2;

FIG. 4 is a cross-sectional view taken along line B-B' in FIG. 2;

FIG. 7A is a cross-sectional view showing the structure of a magnetoresistive element;

FIG. 7B is a cross-sectional view of the magnetoresistive element in a parallel state, illustrating a write operation performed in the magnetoresistive element;

FIG. 7C is a cross-sectional view of the magnetoresistive element in an anti-parallel state, illustrating a write operation performed in the magnetoresistive element;

FIG. 10 is a cross-sectional view of a contact in a first area in a core circuit of the MRAM according to the present embodiment, the cross-sectional view being taken along an X-direction;

FIG. 11 is a cross-sectional view of a contact in a second area in the core circuit of the MRAM according to the present embodiment, the cross-sectional view being taken along the X-direction;

FIG. 12 is a cross-sectional view of a contact in a third area in the core circuit of the MRAM according to the present embodiment, the cross-sectional view being taken along the X-direction;

FIG. 13 is a cross-sectional view of the contact in the first area in the core circuit of the MRAM according to the present embodiment, the cross-sectional view being taken along a Y-direction;

FIG. 14 is a cross-sectional view showing a peripheral circuit for the MRAM according to the present embodiment;

FIGS. 15 to 21 are cross-sectional views showing the steps of manufacturing an MRAM according to the present embodiment;

FIG. 22 is a plan view showing a cell array in an MRAM according to a comparative example;

DETAILED DESCRIPTION

Figure 5:
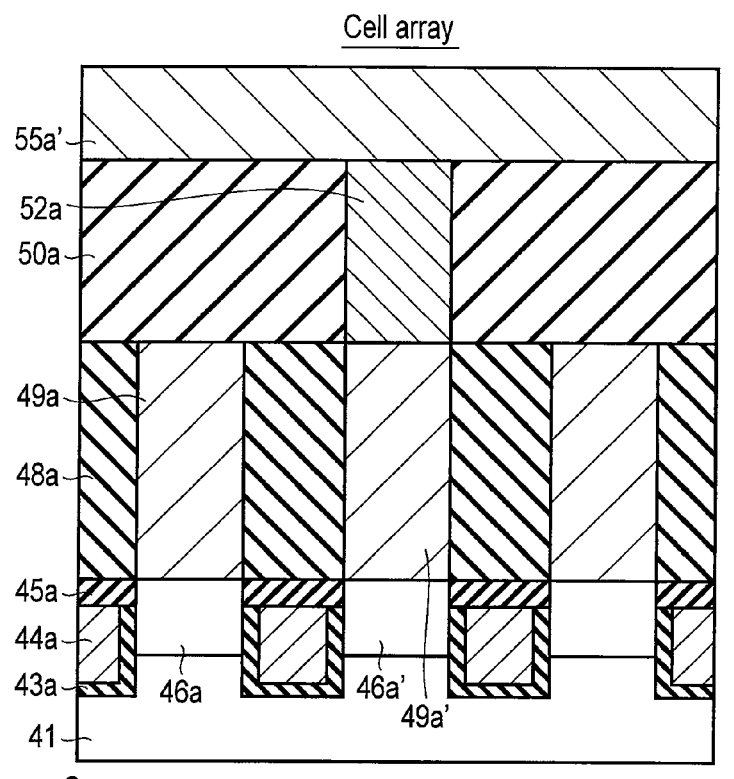
FIG. 5 is a cross-sectional view taken along line C-C' in FIG. 2.

An MRAM comprises, as memory cells, magnetoresistive elements (MTJ elements) and cell transistors that select the respective memory cells. The MRAM needs a large current during a write operation, and thus, the cell transistor used comprises, for example, a gate electrode buried in a semiconductor substrate to enable a large current to be passed. In this case, the buried gate electrode and two diffusion layers between which the gate electrode is sandwiched are formed by what is called a sidewall transfer processing technique so as to have at most the minimum dimensions at which the gate electrode and the diffusion layers can be processed by lithography.

In contrast, for example, a lithography technique is used to shape, into cylinders, magnetoresistive elements formed above the cell transistor and lower electrodes connecting the magnetoresistive elements to the diffusion layers of the cell transistor. Thus, the magnetoresistive elements and the lower electrodes are formed to have the minimum dimensions at which the magnetoresistive elements and the lower electrodes can be processed by lithography.

That is, the processing dimensions of the magnetoresistive elements and the lower electrodes are larger than the processing dimensions of the gate electrode and the two diffusion layers between which the gate electrode is sandwiched. As a result, it is difficult to allow the lower surface of the lower electrode to conform to the upper surface of the diffusion layer (to overlap the upper surface of the diffusion layer), resulting in a reduced contact area between the lower surface and the upper surface. This increases the contact resistance between the lower electrode and the diffusion layer. Furthermore, a variation in mask alignment as described above leads to a variation in contact resistance.

Additionally, forming silicide on the surface of the diffusion layer enables a reduction in contact resistance. However, silicide has a problem with the heat resistance thereof in connection with a subsequent thermal process. In addition, forming silicide increases chip costs.

In contrast, the present embodiment solves this problem by forming the lower electrode so as to increase the contact area between the lower electrode and the diffusion layer.

In general, according to one embodiment, a semiconductor memory device comprises a cell transistor comprising a first gate electrode buried in a semiconductor substrate and a first diffusion layer and a second diffusion layer between which the first gate electrode is sandwiched, a first lower electrode formed on the first diffusion layer, a magnetoresistive element formed on the first lower electrode to store data according to a change in a magnetization state and connected to a bit line located above, a second lower electrode formed on the second diffusion layer, and a first contact formed on the second lower electrode and connected to a source line located above. A contact area between the second lower electrode and the second diffusion layer is larger than a contact area between the first contact and the second lower electrode.

The present embodiment will be described below with reference to the drawings. In the drawings, the same components are denoted by the same reference numbers. Furthermore, duplicate descriptions will be given as necessary.

Embodiment

A semiconductor memory device (MRAM) according to the present embodiment will be described with reference to FIG. 1 to FIG. 26. According to the present embodiment, a memory cell in the MRAM comprises a cell transistor with a buried gate electrode 44a and a magnetoresistive element MTJ. A lower electrode connecting a diffusion layer in the cell transistor to the magnetoresistive element MTJ is shaped identically to the diffusion layer in a plane. This allows a reduction in the contact resistance between the lower electrode and the diffusion layer. The present embodiment will be described below in detail.

Structure According to the Embodiment

The structure of the MRAM according to the present embodiment will be described below with reference to FIG. 1 to FIG. 14.

FIG. 1 is a block diagram showing the general configuration of the MRAM according to the present embodiment.

As shown in FIG. 1, the MRAM comprises a cell array 10, a core circuit 20, and a peripheral circuit 30.

The cell array 10 includes a plurality of memory cells disposed in a matrix to store data. As described below, each of the memory cells comprises a cell transistor and a magnetoresistive element MTJ connected to one end of the current path in the cell transistor.

The core circuit 20 is directly electrically connected to the cell array 10 to directly transfer data. The core circuit 20 comprises a local column switch (LYSW) 11, a subword line decoder (SWD) 12, and a local column switch driver (LYSW-DRV) 13. The local column switch 11 selectively connects a bit line BL to a global bit line in accordance with a column address signal. The subword line decoder 12 receives and then decodes a low address signal. The local column switch driver 13 controllably turns on and off the local column switch 11.

The local column switch 11 includes a transistor with a buried gate, the subword line decoder 12 includes a planar transistor, and the local column switch driver 13 includes both the transistors.

The peripheral circuit 30 is electrically connected to the cell array 10 via the core circuit 20. The peripheral circuit 30 is, for example, a controller that controls the core circuit 20 and the cell array 10.

The cell array 10, the core circuit 20, and the peripheral circuit 30 are formed on the same semiconductor substrate 41.

Figure 6:
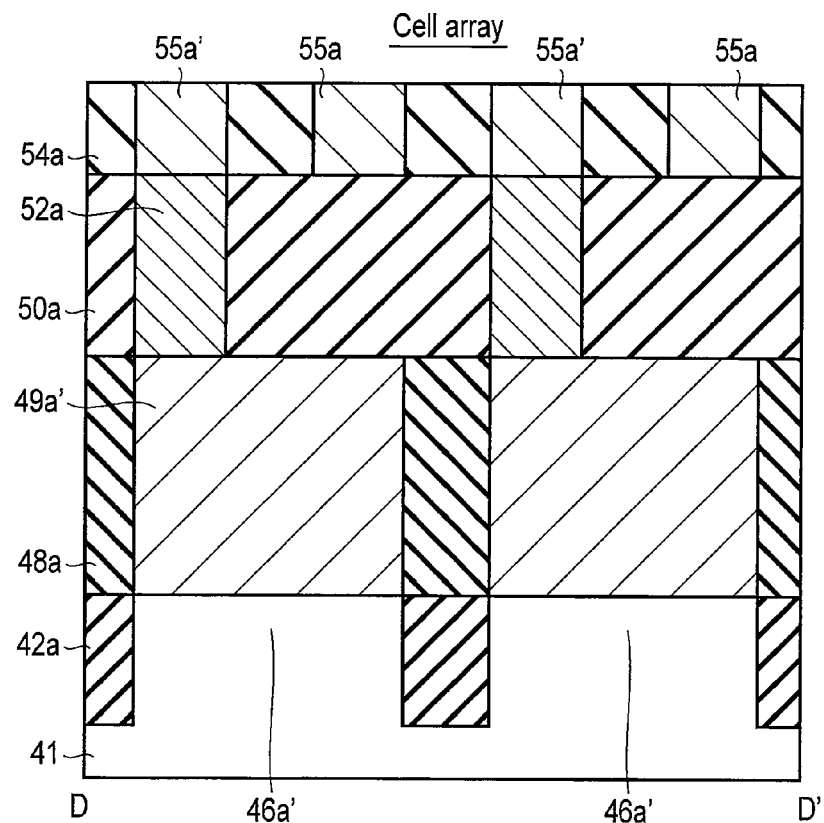
FIG. 6 is a cross-sectional view taken along line D-D' in FIG. 2.

FIG. 2 is a plan view showing the cell array 10 in the MRAM according to the present embodiment. FIG. 3 is a cross-sectional view taken along line A-A' in FIG. 2. FIG. 4 is a cross-sectional view taken along line B-B' in FIG. 2. FIG. 5 is a cross-sectional view taken along line C-C' in FIG. 2. FIG. 6 is a cross-sectional view taken along line D-D' in FIG. 2. More specifically, FIG. 3 is a cross-sectional view of the magnetoresistive element MTJ taken along an X-direction. FIG. 4 is a cross-sectional view of the magnetoresistive element MTJ taken along a Y-direction. FIG. 5 is a cross-sectional view of a source line contact 52a taken along the X-direction. FIG. 6 is a cross-sectional view of the source line contact 52a taken along the Y-direction.

The cell array 10 comprises a plurality of word lines WL and a plurality of dummy word lines DWL disposed therein and extending in the Y-direction and a plurality of bit lines BL and a plurality of sources SL disposed therein and extending in the X-direction, which is orthogonal to the Y-direction. Two word lines WL and one dummy word line DWL are alternately disposed along the X-direction. Furthermore, the bit line BL and the source line SL are alternately disposed along the Y-direction.

As shown in FIG. 2 to FIG. 6, in the cell array 10, isolation insulating layers 42a extending in the X-direction are provided in a front surface area of a p-type semiconductor substrate (for example, a silicon substrate) 41, and these areas form isolation areas. Portions of the front surface area of the semiconductor substrate 41 where isolation insulating layers 42a are not provided form active areas AA. That is, the isolation area and the active area AA are alternately formed along the Y-direction. Isolation insulating layer 42a is formed by, for example, shallow trench isolation (STI). As isolation insulating layer 42a, for example, an insulating material such as silicon nitride (SiN) is used, which has excellent burial characteristics.

As shown in FIG. 3 and FIG. 5, cell transistors using, for example, n-channel metal oxide semiconductor field-effect transistors (MOSFETs) are provided on the semiconductor substrate 41. The cell transistor is configured to comprise a gate electrode 44a containing, for example, polysilicon and buried in a recess formed in the semiconductor substrate 41.

More specifically, the cell transistor comprises a gate insulating layer 43a, a gate electrode 44a, and two diffusion layers (a drain diffusion layer 46a and a source diffusion layer 46a').

Gate insulating layer 43a is formed on the inner surface of the lower side of the recess, formed in a front surface of the semiconductor substrate 41 and extending in the Y-direction. Gate electrode 44a is formed on the inner surface of gate insulating layer 43a so as to fill the lower side of the recess. Gate electrode 44a corresponds to the word line WL. An insulating layer 45a comprising, for example, SiN is formed on upper surfaces of gate insulating layer 43a and gate electrode 44a so as to fill the upper side of the recess. The upper surface of insulating layer 45a is comparable in height to the upper surface of the semiconductor substrate 41 (upper surfaces of the drain diffusion layer 46a and the source diffusion layer 46a' described below).

The drain diffusion layer 46a and the source diffusion layer 46a' are formed in the front surface of the semiconductor substrate 41 so that gate insulating layer 43a, gate electrode 44a, and insulating layer 45a are sandwiched between the drain diffusion layer 46a and the source diffusion layer 46a'. The drain diffusion layer 46a and source diffusion layer 46a' in two memory cells that are adjacent to each other along the X-direction are shared by the two adjacent memory cells. In contrast, as shown in FIG. 4 and FIG. 6, the drain diffusion layer 46a and the source diffusion layer 46a' are each separated into portions along the Y-direction by the isolation area (isolation insulating layer 42a). In other words, in two memory cells that are adjacent to each other along the Y-direction, the portions of each of the drain diffusion layer 46a and source diffusion layer 46a' in the respective memory cells are adjacent to each other via the isolation area. That is, the drain diffusion layer 46a and the source diffusion layer 46a' are positioned in portions of the active area AA other than those portions in which gate insulating layer 43a, gate electrode 44a, and insulating layer 45a are formed. An interlayer insulating layer 48a is formed on the semiconductor substrate 41 (on insulating layer 45a, the drain diffusion layer 46a, the source diffusion layer 46a', and isolation insulating layer 42a).

As shown in FIG. 3 and FIG. 4, lower electrodes 49a are each formed in interlayer insulating layer 48a in contact with the upper surface of the drain diffusion layer 46a. Lower electrode 49a contains, for example, TiN but is not limited to this. Lower electrode 49a is shaped identically to the drain diffusion layer 46a in a plane and formed like, for example, a rectangle. Furthermore, lower electrode 49a is identical in planar area to the drain diffusion layer 46a. Thus, lower electrode 49a is formed to cover the upper surface of the drain diffusion layer 46a. Additionally, as shown in FIG. 4, two lower electrodes 49a adjacent to each other in the Y-direction are separated from each other in the isolation area by interlayer insulating layer 48a. Hence, two magnetoresistive elements MTJ adjacent to each other in the Y-direction are electrically separated from each other.

Lower electrode 49a is not limited to the configuration in which lower electrode 49a is shaped identically to the drain diffusion layer 46a in a plane. The planar area of lower electrode 49a may be larger than the planar area of the drain diffusion layer 46a to the degree that two lower electrodes 49a adjacent to each other in the Y-direction are prevented from being short-circuited. Furthermore, the planar area of lower electrode 49a may be smaller than the planar area of the drain diffusion layer 46a, and lower electrode 49a need not fully cover the drain diffusion layer 46a.

The magnetoresistive element MTJ is formed on lower electrode 49a. The magnetoresistive element MTJ has, for example, a circular planar shape and is shaped like a cylinder. The magnetoresistive element MTJ is formed to contact a portion of the upper surface of lower electrode 49a. In other words, the magnetoresistive element MTJ and lower electrode 49a partly overlap in a plane. This is because the magnetoresistive element MTJ, described below, and lower electrode 49a are processed in different manners. Furthermore, the magnetoresistive element MTJ has a smaller planar area than lower electrode 49a. Thus, the contact area between the magnetoresistive element MTJ and lower electrode 49a is smaller than the contact area between lower electrode 49a and the drain diffusion layer 46a.

Of three gate electrodes 44a adjacent to one another in the X-direction, two gate electrodes 44a are electrically connected to the magnetoresistive element MTJ and correspond to word lines W. One gate electrode 44a is not electrically connected to the magnetoresistive element MTJ and corresponds to a dummy word line DWL.

FIG. 7A is a cross-sectional view showing the structure of the magnetoresistive element MTJ. Here, as the magnetoresistive element MTJ, a storage layer 71, a tunnel barrier layer 72, and a reference layer 73 will be mainly illustrated.

As shown in FIG. 7A, the magnetoresistive element MTJ includes the storage layer 71, which is a ferromagnetic layer, the reference layer 73, which is a ferromagnetic layer, and the tunnel barrier layer 72, which is a nonmagnetic layer formed between the storage layer 71 and the reference layer 73.

The storage layer 71 is a ferromagnetic layer with a variable direction of magnetization and has perpendicular magnetic anisotropy exhibiting perpendicularity or substantial perpendicularity to a film plane (upper/lower surface). Here, the variable direction of magnetization means that the direction of magnetization varies with respect to a predetermined write current. Furthermore, the substantial perpendicularity means that the direction of remanent magnetization falls within the range of $45°<\theta\leq 90°$ with respect to the film plane.

The tunnel barrier layer 72 is formed on the storage layer 71. The tunnel barrier layer 72 is a nonmagnetic layer formed of, for example, MgO.

The reference layer 73 is formed on the tunnel barrier layer 72. The reference layer 73 is a ferromagnetic layer having an invariable direction of magnetization and perpendicular magnetic anisotropy exhibiting perpendicularity or substantial perpendicularity to the film plane. Here, the invariable direction of magnetization indicates that the direction of magnetization does not vary with respect to a predetermined write current. That is, the reference layer 73 provides a more rigid reversal energy barrier for the direction of magnetization than the storage layer 71.

FIG. 7B is a cross-sectional view of the magnetoresistive element MTJ in a parallel state, illustrating a write operation performed in the magnetoresistive element. FIG. 7C is a cross-sectional view of the magnetoresistive element MTJ in an anti-parallel state, illustrating a write operation performed in the magnetoresistive element.

The magnetoresistive element MTJ is of, for example, a spin transfer type. Thus, if data is written to or read from the magnetoresistive element MTJ, a current is passed through the magnetoresistive element MTJ in both directions perpendicular to the film plane.

More specifically, data is written to the magnetoresistive element MTJ as follows.

If a current flows from the storage layer 71 to the reference layer 73, that is, electrons are supplied which migrate from the reference layer 73 toward the storage layer 71, as shown in FIG. 7B, the electrons, spin-polarized in the same direction as the direction of magnetization of the reference layer 73, are transferred to the storage layer 71. In this case, the direction of magnetization of the storage layer 71 is aligned with the direction of magnetization of the reference layer 73. This makes the direction of magnetization of the reference layer 73 parallel to the direction of magnetization of the storage layer 71. In this parallel state, the magnetoresistive element MTJ has the minimum resistance. This case is defined to be, for example, binary 0.

In contrast, if a current flows from the reference layer 73 to the storage layer 71, that is, electrons are supplied which migrate from the storage layer 71 toward the reference layer 73, as shown in FIG. 7C, the electrons, spin-polarized in a direction opposite to the direction of magnetization of the reference layer 73 as a result of reflection by the reference layer 73, are transferred to the storage layer 71. In this case, the direction of magnetization of the storage layer 71 is aligned with a direction opposite to the direction of magnetization of the reference layer 73. This makes the direction of magnetization of the reference layer 73 anti-parallel to the direction of magnetization of the storage layer 71. In this anti-parallel state, the magnetoresistive element MTJ has the maximum resistance. This case is defined to be, for example, binary 1.

Furthermore, data is read from the magnetoresistive element MTJ as follows.

A read current is supplied to the magnetoresistive element MTJ. The read current is set (such that it is less than the write current) to prevent the direction of magnetization of the storage layer 71 from being inverted. Binary 0 and 1 can be read by detecting a change in the resistance of the magnetoresistive element MTJ at the time of the setting.

An interlayer insulating layer 50a is formed on interlayer insulating layer 48a, lower electrode 49a, and the magnetoresistive element MTJ. Bit line contacts 51 are each formed in interlayer insulating layer 50a in contact with the upper surface of the corresponding magnetoresistive element MTJ.

An interlayer insulating layer 54a is formed on interlayer insulating layer 50a and the bit line contacts 51. Interconnects 55a are formed in interlayer insulating layer 54a so as to reach the respective bit line contacts 51 and to be electrically connected to the respective bit line contacts 51. Interconnects 55a correspond to bit lines BL.

In contrast, as shown in FIG. 5 and FIG. 6, lower electrodes 49a' are formed in interlayer insulating layer 48a in contact with the upper surface of the source diffusion layer 46a'. Lower electrode 49a' lies in the same layer as that in which lower electrode 49a lies. Thus, lower electrode 49a' contains, for example, TiN. Lower electrode 49a' is shaped identically to the source diffusion layer 46a' in a plane and formed like, for example, a rectangle. Furthermore, lower electrode 49a' is identical in planar area to the source diffusion layer 46a'. Thus, lower electrode 49a' is formed to cover the upper surface of the drain diffusion layer 46a'. Additionally, as shown in FIG. 6, two lower electrodes 49a' adjacent to each other in the Y-direction are separated from each other in the isolation area by interlayer insulating layer 48a. Hence, two source line contacts 52a adjacent to each other in the Y-direction are electrically separated from each other.

Lower electrode 49a' is not limited to the configuration in which lower electrode 49a' is shaped identically to the source diffusion layer 46a' in a plane. The planar area of lower electrode 49a' may be larger than the planar area of the source diffusion layer 46a' to the degree that two lower electrodes 49a' adjacent to each other in the Y-direction are prevented from being short-circuited. Furthermore, the planar area of lower electrode 49a' may be smaller than the planar area of the source diffusion layer 46a', and lower electrode 49a' need not fully cover the source diffusion layer 46a'.

Interlayer insulating layer 50a is formed on lower electrodes 49a and interlayer insulating layer 48a. The source line contacts 52a are each formed in interlayer insulating layer 50a in contact with the upper surface of the corresponding lower electrode 49a'. The source line contact 52a has, for example, a circular planar shape and is shaped like a cylinder. The source line contact 52a is formed such that the lower surface thereof entirely contacts the upper surface of lower electrode 49a'. Furthermore, the source line contact 52a has a smaller planar area than lower electrode 49a'. Thus, the contact area between the source line contact 52a and lower electrode 49a' is smaller than the contact area between lower electrode 49a' and the source diffusion layer 46a'.

Interlayer insulating layer 54a is formed on interlayer insulating layer 50a and the source line contacts 52a. Interconnects 55a' are formed in interlayer insulating layer 54a so as to reach the respective source line contacts 52a and to be electrically connected to the respective source line contacts 52a. Interconnects 55a' lie in the same layer as that in which interconnects 55a (bit lines BL) lie, and correspond to the source lines SL extending parallel to the bit lines BL at the same height as that at which the bit lines BL extend.

Figure 8:
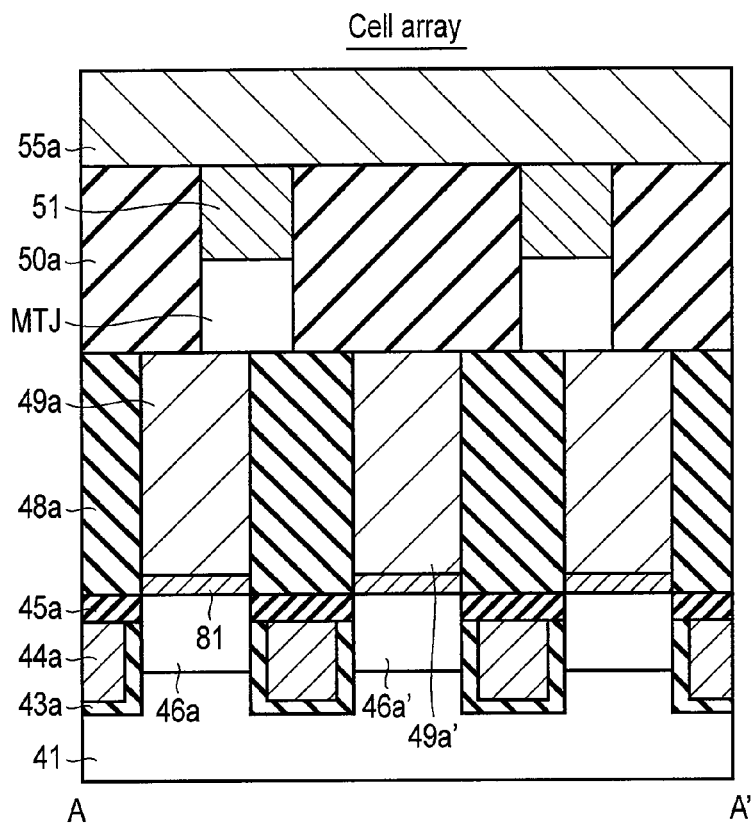
FIG. 8 is a cross-sectional view taken along line A-A' in FIG. 2, showing a first modification of the present embodiment.
Figure 9:
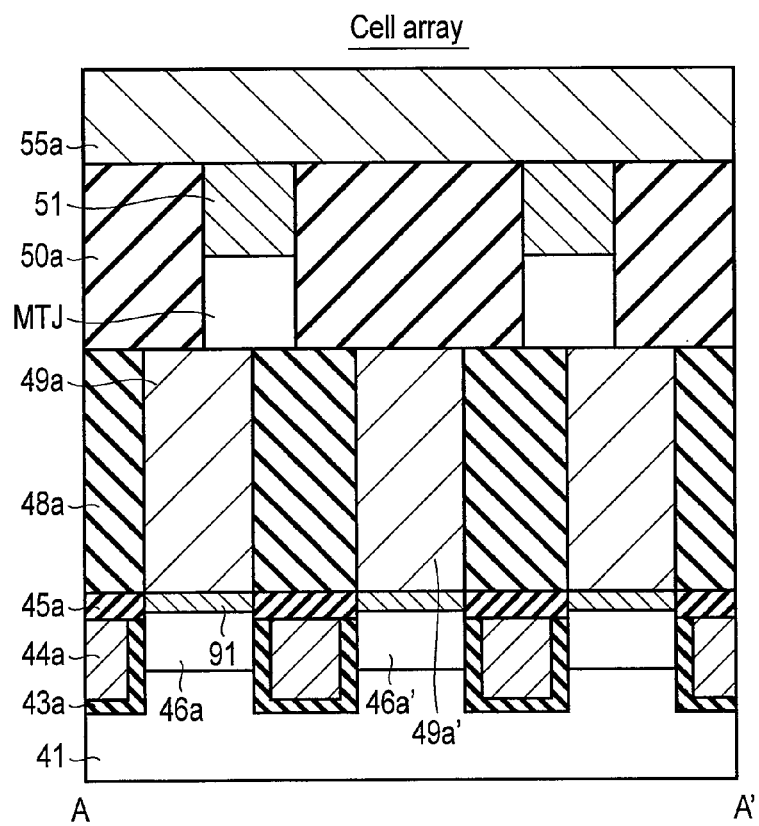
FIG. 9 is a cross-sectional view taken along line A-A' in FIG. 2, showing a second modification of the present embodiment.

FIG. 8 is a cross-sectional view taken along line A-A' in FIG. 2, showing a first modification of the present embodiment. FIG. 9 is a cross-sectional view taken along line A-A' in FIG. 2, showing a second modification of the present embodiment.

As shown in FIG. 8, in the first modification, a metal layer 81 is formed between the drain diffusion layer 46a and lower electrode 49a and between the source diffusion layer 46a' and lower electrode 49a'. The metal layer 81 is formed on the drain diffusion layer 46a and the source diffusion layer 46a' and contains, for example, Ti. The metal layer 81, comprising Ti, is formed between the semiconductor substrate 41 (the drain diffusion layer 46a and the source diffusion layer 46a') and lower electrodes 49a and 49a', comprising TiN. This enables a reduction in the contact resistance at these interfaces.

In contrast, in the second modification, a silicide layer 91 is formed between the drain diffusion layer 46a and lower electrode 49a and between the source diffusion layer 46a' and lower electrode 49a', as shown in FIG. 9. The silicide layer 91 is formed on the front surface of the semiconductor substrate 41 (the drain diffusion layer 46a and the source diffusion layer 46a') and contains, for example, TiSi. The silicide layer 91, comprising TiSi, is formed between the semiconductor substrate 41 (the drain diffusion layer 46a and the source diffusion layer 46a') and lower electrodes 49a and 49a', comprising TiN. This enables a reduction in the contact resistance at these interfaces, as is the case with the first modification.

FIG. 10 is a cross-sectional view of a contact 52b in a first area in the core circuit 20 of the MRAM according to the present embodiment, the cross-sectional view being taken along the X-direction. FIG. 11 is a cross-sectional view of a contact 52b in a second area in the core circuit 20 of the MRAM according to the present embodiment, the cross-sectional view being taken along the X-direction. FIG. 12 is a cross-sectional view of a contact 52b in a third area in the core circuit 20 of the MRAM according to the present embodiment, the cross-sectional view being taken along the X-direction. FIG. 13 is a cross-sectional view of contact 52b in the first area in the core circuit of the MRAM according to the present embodiment, the cross-sectional view being taken along the Y-direction. That is, the core circuit 20 comprises the different contacts 52b disposed in the first to third areas, respectively.

By way of example, the core circuit 20 comprises a plurality of gate electrodes 44b disposed therein and extending in the Y-direction and a plurality of interconnects 55b disposed therein and extending in the X-direction. Gate electrodes 44b lie in the same layer in the cell array 10 as the layer in which gate electrodes 44a lie. Interconnects 55b lie in the same layer in the cell array 10 as the layer in which the bit lines BL and the source lines SL lie.

As shown in FIG. 13, in the core circuit 20, isolation insulating layers 42b extending in the X-direction are provided in the front surface area of the p-type semiconductor substrate (for example, the silicon substrate) 41. Isolation insulating layers 42b form isolation areas. Portions of the front surface area of the semiconductor substrate 41 where isolation insulating layers 42b are not provided form the active areas AA. That is, the isolation area and the active area AA are alternately formed along the Y-direction. Isolation insulating layer 42b is formed by, for example, STI. As isolation insulating layer 42b, for example, an insulating material such as SiN is used, which has excellent burial characteristics.

As shown in FIG. 10 to FIG. 12, core transistors using, for example, n-channel MOSFETs are provided on the semiconductor substrate 41 in the first area to the third area in the core circuit 20. The core transistor is configured to comprise gate electrode 44b containing, for example, polysilicon and buried in a recess formed in the semiconductor substrate 41. That is, the core transistor is structured similarly to the cell transistor.

More specifically, the core transistor comprises a gate insulating layer 43b, gate electrode 44b, and two diffusion layers 46b. The two diffusion layers are not particularly distinguished from each other and are thus both referred as diffusion layers 46b.

Gate insulating layer 43b is formed on the inner surface of the lower side of the recess, formed in the front surface of the semiconductor substrate 41 and extending in the Y-direction. Gate electrode 44b is formed on the inner surface of gate insulating layer 43b so as to fill the lower side of the recess. An insulating layer 45b comprising, for example, SiN is formed on the upper surfaces of gate insulating layer 43b and gate electrode 44b so as to fill the upper side of the recess. The upper surface of insulating layer 45b is comparable in height to the upper surface (the upper surface of the diffusion layer 46 described below) of the semiconductor substrate 41.

The two diffusion layers 46b are formed in the front surface of the semiconductor substrate 41 so as to sandwich gate insulating layer 43b, gate electrode 44b, and insulating layer 45b between the diffusion layers 46b. Diffusion layers 46b in two core transistors adjacent to each other along the X-direction are shared by the two adjacent core transistors. In contrast, as shown in FIG. 13, diffusion layer 46b is separated into portions along the Y-direction by the isolation area (isolation insulating layer 42b). In other words, the portions of diffusion layer 46b in the respective two core transistors adjacent to each other along the Y-direction are adjacent to each other via the isolation insulating layer. That is, diffusion layers 46b are positioned in portions of the active area AA other than those portions in which gate insulating layer 43b, gate electrode 44b, and insulating layer 45b are formed. An interlayer insulating layer 48b is formed on the semiconductor substrate 41 (on insulating layer 45b, the drain diffusion layer 46b, and isolation insulating layer 42b).

As shown in FIG. 10 and FIG. 13, a lower electrode 49b is formed in interlayer insulating layer 48b in contact with the upper surface of diffusion layer 46b. Lower electrode 49b contains, for example, TiN. Lower electrode 49b is sized comparably to diffusion layer 46b in the X-direction. In contrast, lower electrode 49b extends in the Y-direction. That is, lower electrode 49b is formed to extend over to the adjacent diffusion layer 46b via the isolation area. Lower electrode 49b is formed to cover the upper surface of diffusion layer 46b. Lower electrode 49b may have a smaller planar area than diffusion layer 46b and need not fully cover diffusion layer 46b.

Furthermore, lower electrode 49b in the core circuit 20 lies in the same layer as that in which lower electrodes 49a and 49a' in the cell array 10 lie. That is, forming lower electrodes 49a and 49a' in the cell array 10 allows lower electrode 49b in the core circuit 20 to be similarly formed. Lower electrode 49b in the core circuit 20 is sized larger than lower electrodes 49a and 49a' in the cell array 10 in both the X- and Y-direction. Thus, lower electrode 49b in the core circuit 20 has a larger planar area than lower electrodes 49a and 49a' in the cell array 10.

An interlayer insulating layer 50b is formed on lower electrode 49b and interlayer insulating layer 48b. Contacts 52b are each formed in interlayer insulating layer 50b in contact with the upper surface of lower electrode 49b. Contact 52b has, for example, a circular planar shape and is shaped like a cylinder. Contact 52b is formed such that the lower surface thereof entirely contacts the upper surface of lower electrode 49b. Furthermore, contact 52b has a smaller planar area than lower electrode 49b. Thus, the contact area between contact 52b and lower electrode 49b is smaller than the contact area between lower electrode 49b and diffusion layer 46b.

Furthermore, as shown in FIG. 13, lower electrode 49b extends in the Y-direction. That is, lower electrode 49b is also formed on the isolation area. Thus, lower electrode 49b is in contact with lower surfaces of two contacts 52b adjacent to each other in the Y-direction. Namely, the two contacts 52b adjacent to each other in the Y-direction are electrically connected together. Hence, two core transistors adjacent to each other in the Y-direction can be connected together in parallel. This enables the two core transistors to pass a large current.

An interlayer insulating layer 54b is formed on interlayer insulating layer 50b and contacts 52b. Interconnects 55b are formed in interlayer insulating layer 54b so as to reach the respective contacts 52b and to be electrically connected to the respective contacts 52b. Interconnects 55b lie in the same layer as that in which the bit lines BL and the source lines SL lie.

As shown in FIG. 11, in the second area, lower electrode 49b is formed in interlayer insulating layer 48b in contact with a part of the upper surface of diffusion layer 46b. Lower electrode 49b is sized comparably to diffusion layer 46b in the X-direction. In contrast, lower electrode 49b extends in the Y-direction. That is, lower electrode 49b is formed to extend over to the adjacent diffusion layer 46b via the isolation area. Lower electrode 49b is formed to cover a part of the upper surface of diffusion layer 46b. Furthermore, lower electrode 49b is formed to cover a part of the upper surface of insulating layer 45b. In other words, lower electrode 49b is formed to overlap the part of the upper surface of diffusion layer 46b.

Interlayer insulating layer 50b is formed on lower electrode 49b and interlayer insulating layer 48b. A contact 52b is formed in interlayer insulating layer 50b and interlayer insulating layer 48b in contact with a part of the upper surface of lower electrode 49b and a part of the upper surface of diffusion layer 46b which part is different from the part of the upper surface of lower electrode 49b. That is, a part of contact 52b is formed to penetrate interlayer insulating layer 50b to reach the upper surface of lower electrode 49b. The other part of contact 52b is formed to penetrate interlayer insulating layer 50b and interlayer insulating layer 48b to reach the upper surface of diffusion layer 46b. The part of the upper surface of diffusion layer 46b which is contacted by contact 52b is not overlapped by lower electrode 49b.

As shown in FIG. 12, lower electrode 49b is not formed in the third area. Thus, contact 52b is formed in interlayer insulating layer 50b and interlayer insulating layer 48b in contact with the upper surface of diffusion layer 46b. That is, contact 52b is formed to penetrate interlayer insulating layer 50b and interlayer insulating layer 48b to reach the upper surface of diffusion layer 46b.

FIG. 14 is a cross-sectional view showing the peripheral circuit 30 in the MRAM according to the present embodiment.

By way of example, the peripheral circuit 30 comprises a plurality of gate electrodes 54 disposed therein and extending in the Y-direction and a plurality of interconnects 55c disposed therein and extending in the X-direction. Interconnects 55c lie in the same layer as that in which the bit lines BL and source lines SL in the cell array 10 lie.

As shown in FIG. 14, in the peripheral circuit 30, isolation insulating layers 42c are provided in the front surface area of the p-type semiconductor substrate (for example, a silicon substrate) 41 and form isolation areas. Portions of the front surface area of the semiconductor substrate 41 where isolation insulating layers 42c are not provided form active areas AA. Isolation insulating layer 42a is formed by, for example, STI. As isolation insulating layer 42c, for example, an insulating material such as SiN is used which has excellent burial characteristics.

As shown in FIG. 14, a peripheral transistor using, for example, an n-channel MOSFET is provided on the semiconductor substrate 41. The peripheral transistor is a planar transistor.

More specifically, the peripheral transistor comprises a gate insulating layer 53, a gate electrode 54, and two diffusion layers 55. Here, the two diffusion layers are not particularly distinguished from each other and are thus both referred as diffusion layers 55.

Gate insulating layer 53 is formed on the semiconductor substrate 41. Gate electrode 54 is formed on gate insulating layer 53. A part of the front surface of the semiconductor substrate 41 under gate insulating layer 53 serves as a channel. Two diffusion layers 55 are formed in the front surface of the semiconductor substrate 41 so as to sandwich the channel between the layers 55. An interlayer insulating layer 48c is formed on the semiconductor substrate 41 so as to cover the peripheral transistor.

A contact 49 is formed in interlayer insulating layer 48c in contact with the upper surface of diffusion layer 55. An interlayer insulating layer 50c is formed on interlayer insulating layer 48c and contact 49. A contact 56 is formed in interlayer insulating layer 50c in contact with the upper surface of contact 49. An interlayer insulating layer 54c is formed on interlayer insulating layer 50c and contact 56. An interconnect 55c is formed in interlayer insulating layer 54c so as to reach contacts 56 and to be electrically connected to contact 56. Interconnect 55c lies in the same layer as that in which the bit lines BL and the source lines SL lie.

Method for Manufacture According to the Embodiment

A method for manufacturing an MRAM according to the present embodiment will be described below with reference to FIG. 15 to FIG. 21.

FIG. 15 to FIG. 21 are cross-sectional views showing the steps of manufacturing an MRAM according to the present embodiment. Here, FIG. 15 to FIG. 21 show cross-sectional views of the cell array 10 taken along line A-A' in FIG. 2, cross-sectional views of the cell array 10 taken along line D-D' in FIG. 2, cross-sectional views of the contact in the first area of the core circuit 20 taken along the Y-direction, and cross-sectional views of the peripheral circuit 30.

Figure 15:
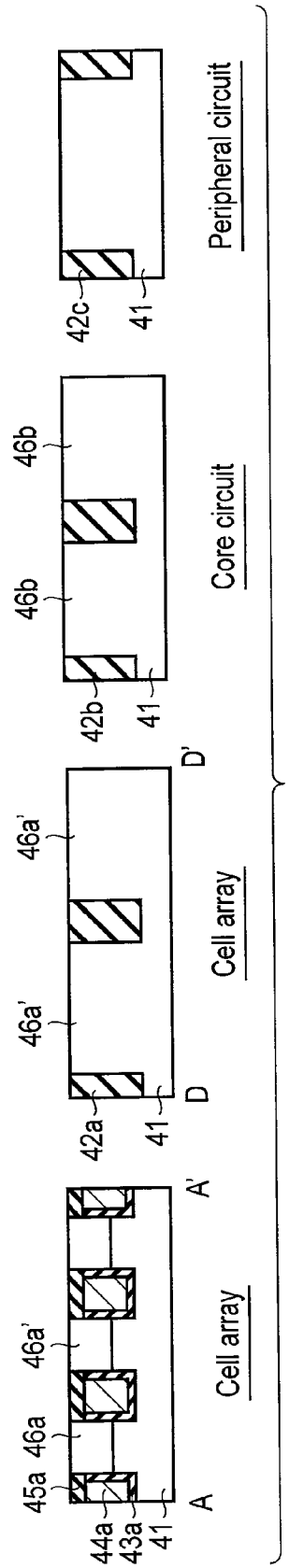

First, as shown in FIG. 15, isolation insulating layers 42a, 42b, and 42c are formed in the front surface area of the semiconductor substrate 41 in the cell array 10, the core circuit 20, and the peripheral circuit 30, respectively. The areas formed correspond to isolation areas. Isolation insulating layers 42a, 42b, and 42c are formed by, for example, STI. As isolation insulating layers 42a, 42b, and 42c, for example, an insulating material such as SiN is used which has excellent burial characteristics.

Then, in each of the cell array 10 and the core circuit 20, cell transistors and core transistors are formed in the semiconductor substrate 41. More specifically, recesses extending in the Y-direction are formed in the front surface of the semiconductor substrate 41. Gate insulating layers 43a and 43b are each formed on the inner surface of the lower side of the corresponding recess. Then, gate electrodes 44a and 44b are each formed on the inner surface of the corresponding one of gate insulating layers 43a and 43b so as to fill the lower side of the corresponding recess. Then, insulating layers 45a and 45b comprising, for example, SiN are formed on the upper surfaces of gate insulating layer 43a and gate electrode 44a and on the upper surfaces of gate insulating layer 43b and gate electrode 44b, respectively, so as to fill the upper sides of the respective recesses. The upper surfaces of insulating layers 45a and 45b are comparable in height to the upper surface of the semiconductor substrate 41. Then, drain diffusion layers 46a and source diffusion layers 46a' are formed in the front surface of the semiconductor substrate 41 so as to sandwich gate insulating layer 43a, gate electrode 44a, and insulating layer 45a between diffusion layers 46a and 46a'. Two diffusion layers 46b are formed to sandwich gate insulating layer 43b, gate electrode 44b, and insulating layer 45b between diffusion layers 46b.

Here, the recesses in the front surface of the semiconductor substrate 41 are formed by a sidewall transfer processing technique. More specifically, a core material is formed on the semiconductor substrate 41 and patterned by lithography. A sidewall material is formed on the sidewall of the patterned core material. Subsequently, the core material is removed so as to leave the sidewall material on the semiconductor substrate 41. The recesses are formed in the semiconductor substrate 41 through the sidewall material as a mask. The resultant recesses can have at most the minimum dimensions at which the recesses can be processed by lithography, allowing the formation of cell transistors and core transistors.

Figure 16:
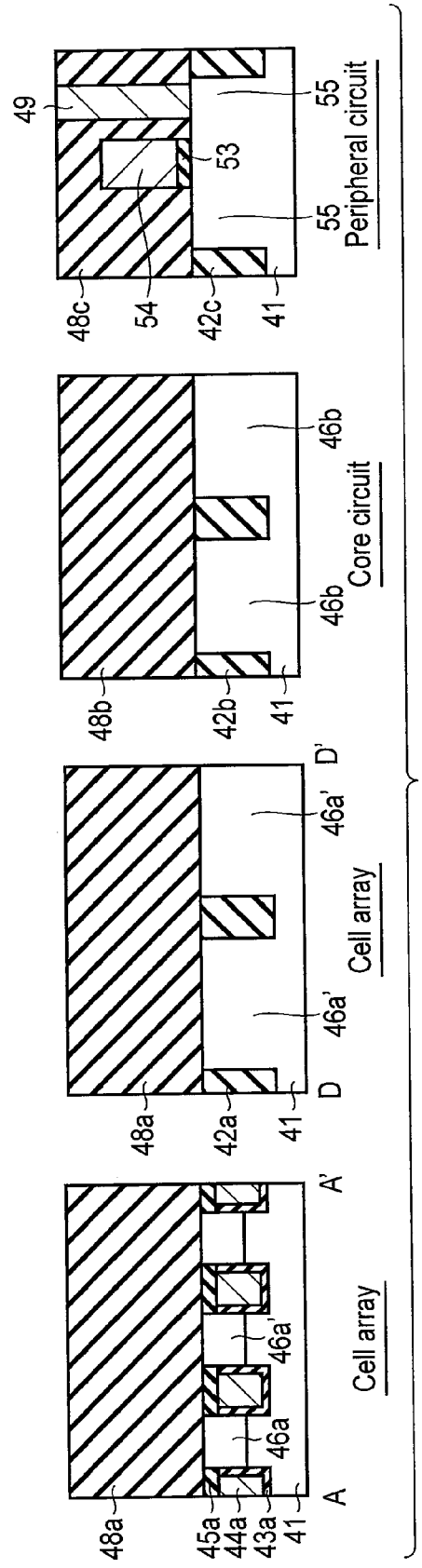

Then, as shown in FIG. 16, a peripheral transistor is formed on the semiconductor substrate 41 in the peripheral circuit 30. More specifically, a gate insulating layer 53 is formed on the semiconductor substrate 41. A gate electrode 54 is formed on gate insulating layer 53. Subsequently, two diffusion layers 55 are formed in the front surface of the semiconductor substrate 41 so as to sandwich the channel in the front surface of the semiconductor substrate 41 between the layers 55, the channel corresponding to the bottom of gate insulating layer 53.

Then, interlayer insulating layers 48a, 48b, and 48c are formed on the semiconductor substrate 41 so as to cover the entire surfaces of the cell array 10, the core circuit 20, and the peripheral circuit 30. Thus, the cell transistor, the core transistor, and the peripheral transistor are covered with interlayer insulating layers 48a, 48b, and 48c, respectively. Subsequently, in the peripheral circuit 30, contact 49 is formed in interlayer insulating layer 48c in contact with the upper surface of diffusion layer 55.

Figure 17:
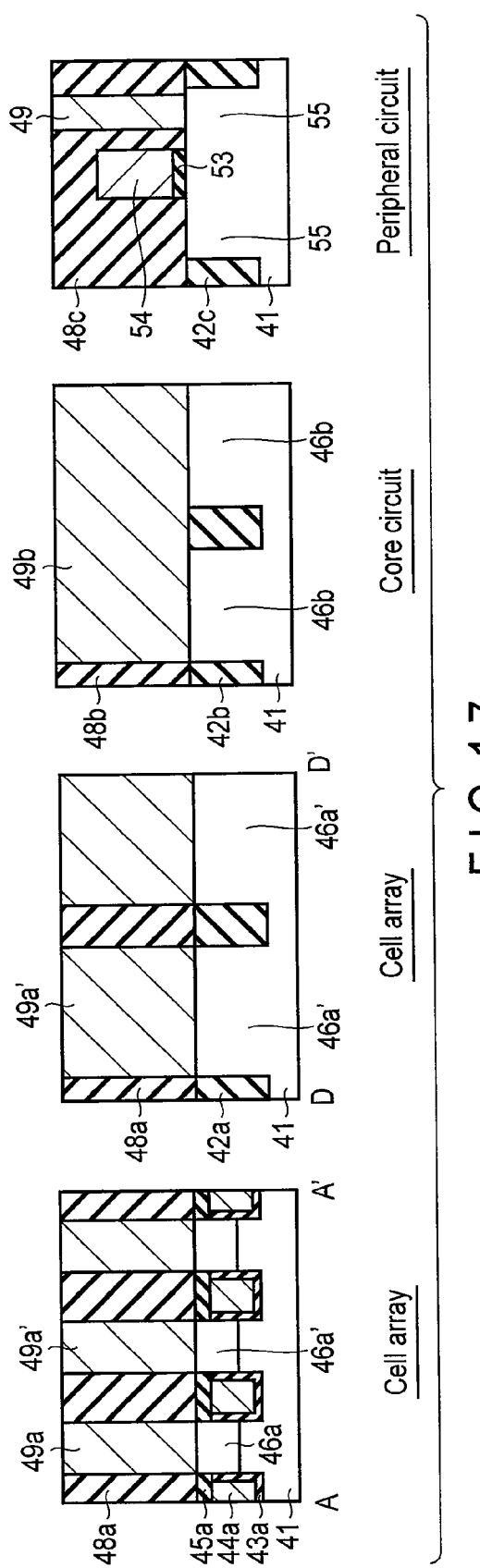

Then, in the cell array 10, lower electrodes 49a and 49a' are formed in interlayer insulating layer 48a in contact with the upper surfaces of the drain diffusion layer 46a and the source diffusion layer 46a', respectively, as shown in FIG. 17. At the same time, in the core circuit 20, a lower electrode 49a is formed in interlayer insulating layer 48b in contact with diffusion layer 46b. Lower electrodes 49a and 49' are formed in trenches (not shown in the drawings) in interlayer insulating layers 48a and 48b. Thus, lower electrodes 49a, 49a', and 49b are shaped identically to the drain diffusion layer 46a and the source diffusion layer 46a' in a plane. Additionally, lower electrode 49b is sized comparably to diffusion layer 46b in the X-direction and extend in the Y-direction.

In other words, in the cell array 10, two lower electrodes 49a adjacent to each other in the Y-direction are separated from each other on the isolation area by interlayer insulating layer 48a. Two lower electrodes 49a' adjacent to each other in the Y-direction are separated from each other on the isolation area by interlayer insulating layer 48a. Furthermore, in the core circuit 20, lower electrode 49b extends in the Y-direction. That is, lower electrode 49b is also formed on the isolation area.

Then, in the cell array 10, magnetoresistive elements MTJ are formed on lower electrode 49a as shown in FIG. 18. The magnetoresistive element MTJ is formed to have, for example, a circular planar shape and shaped like a cylinder, by means of the lithography technique. The magnetoresistive element MTJ is formed in contact with a part of the upper surface of lower electrode 49a. In other words, the magnetoresistive element MTJ and lower electrode 49a partly overlap in a plane.

Then, interlayer insulating layers 50a, 50b, and 50c are formed to cover the entire surfaces of the cell array 10, the core circuit 20, and the peripheral circuit 30, respectively. Subsequently, in the cell array 10, bit line contacts 51 are each formed in interlayer insulating layer 50a in contact with the upper surface of the corresponding magnetoresistive element MTJ.

Then, in the cell array 10, source line contacts 52a are each formed in interlayer insulating layer 50a in contact with the upper surface of the corresponding lower electrode 49a', as shown in FIG. 19. The source line contact 52a has, for example, a circular planar shape and is shaped like a cylinder. The source line contact 52a is formed such that the lower surface thereof entirely contacts the upper surface of lower electrode 49a'. In contrast, at the same time, contacts 52b are each formed in interlayer insulating layer 50b of the core circuit 20 in contact with the upper surface of lower electrode 49b. Contact 52b has, for example, a circular planar shape and is shaped like a cylinder. Contact 52b is formed such that the lower surface thereof entirely contacts the upper surface of lower electrode 49b.

Then, in the peripheral circuit 30, a contact 56 is formed in interlayer insulating layer 50c in contact with contact 49, as shown in FIG. 20. Subsequently, interlayer insulating layers 54a, 54b, and 54c are formed to cover the entire surfaces of the cell array 10, the core circuit 20, and the peripheral circuit 30, respectively.

Then, in the cell array 10, interlayer insulating layers 55a that are bit lines BL are formed in interlayer insulating layer 54a so as to reach the respective bit line contacts 51 and to be electrically connected to the respective bit line contacts 51, as shown in FIG. 21. Furthermore, interconnects 55a' that are source lines SL, are formed in interlayer insulating layer 54a so as to reach the respective source line contacts 52a and to be electrically connected to the respective source line contacts 52a. At the same time, in the core circuit 20, interconnects 55b are formed in interlayer insulating layer 54b so as to reach the respective contacts 52b and to be electrically connected to the respective contacts 52b. Moreover, at the same time, an interconnect 55c is formed in interlayer insulating layer 54c of the peripheral circuit 30 so as to reach contact 56 and to be electrically connected to contact 56.

As described above, the MRAM according to the present embodiment is formed.

Effects of the Embodiment

Figure 23:
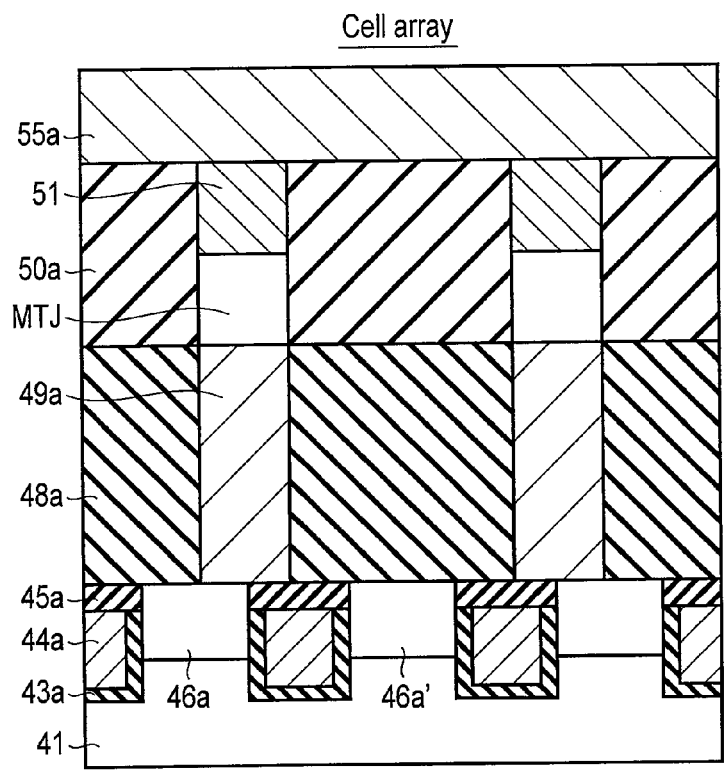
FIG. 23 is a cross-sectional view taken along line I-I' in FIG. 22.
Figure 24:
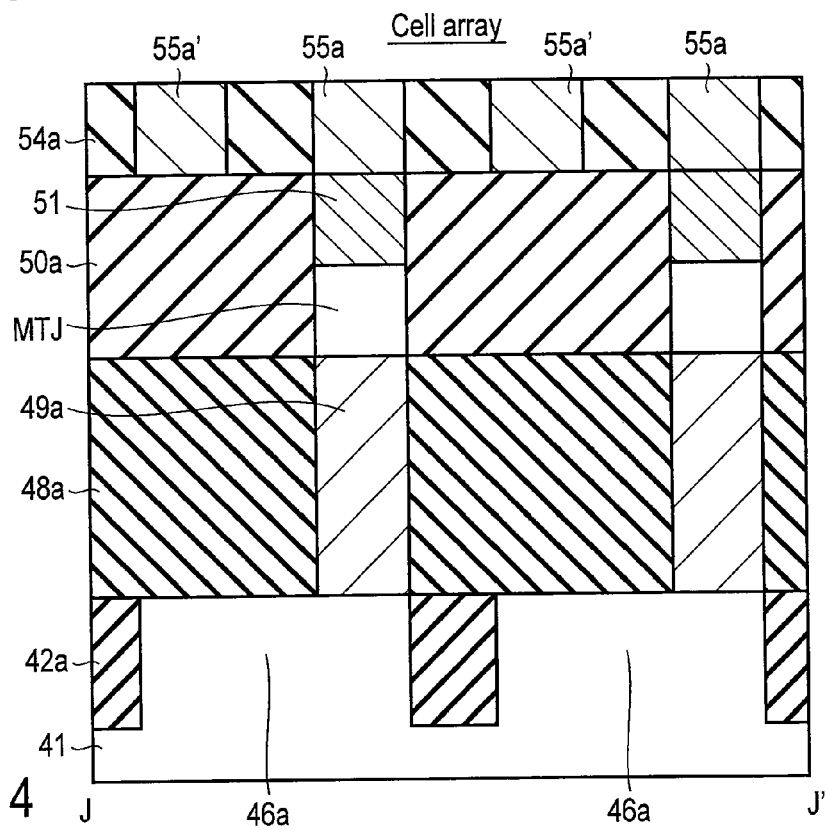
FIG. 24 is a cross-sectional view taken along line J-J' in FIG. 22.
Figure 25:
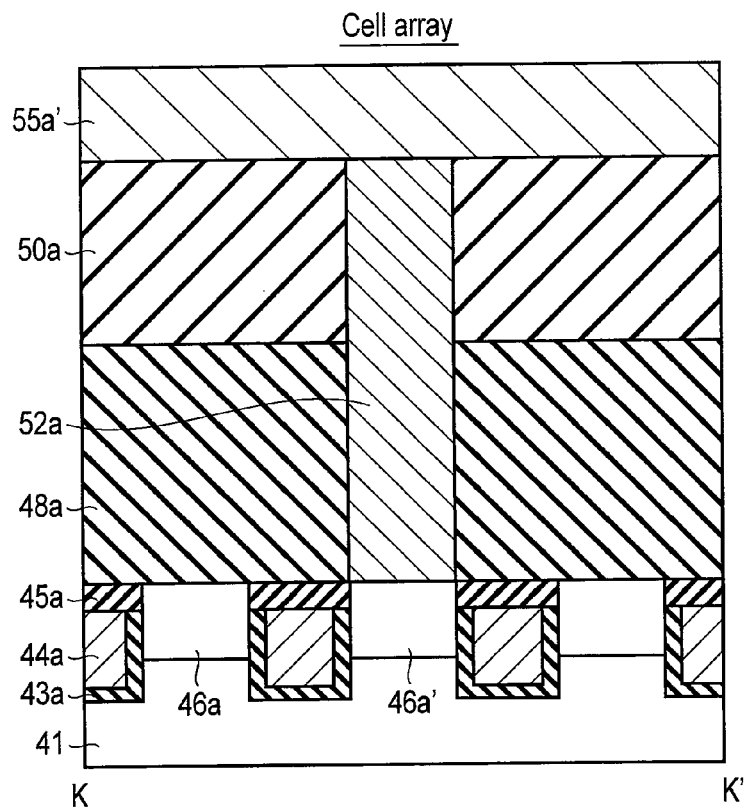
FIG. 25 is a cross-sectional view taken along line K-K' in FIG. 22.
Figure 26:
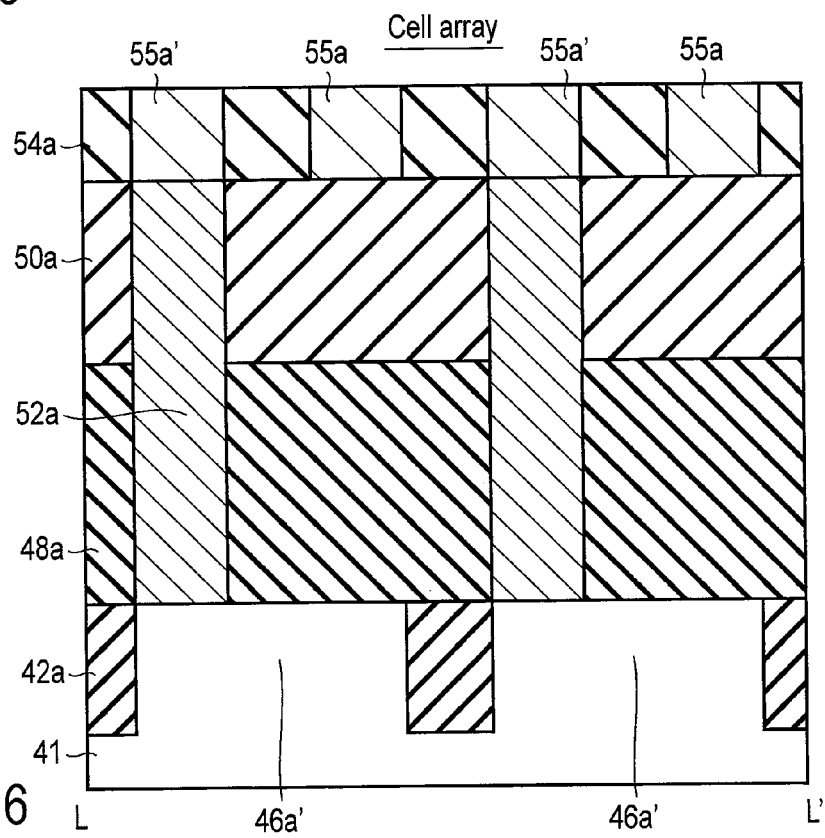
FIG. 26 is a cross-sectional view taken along line L-L' in FIG. 22.

FIG. 22 is a plan view showing a cell array in an MRAM according to a comparative example. FIG. 23 is a cross-sectional view taken along line I-I' in FIG. 22. FIG. 24 is a cross-sectional view taken along line J-J' in FIG. 22. FIG. 25 is a cross-sectional view taken along line K-K' in FIG. 22. FIG. 26 is a cross-sectional view taken along line L-L' in FIG. 22. More specifically, FIG. 23 is a cross-sectional view of the magnetoresistive element MTJ taken along the X-direction. FIG. 24 is a cross-sectional view of the magnetoresistive element MTJ taken along the Y-direction. FIG. 25 is a cross-sectional view of the source line contact 52a taken along the X-direction. FIG. 26 is a cross-sectional view of the source line contact 52a taken along the Y-direction.

As shown in FIG. 22 to FIG. 24, in the comparative example, lower electrode 49a positioned between the drain diffusion layer 46a and the magnetoresistive element MTJ is formed to contact only a part of the upper surface of the drain diffusion layer 46a. In other words, lower electrode 49a and the drain diffusion layer 46a only partly overlap in a plane. This is because a method for processing varies between the steps of forming lower electrodes 49a and the steps of forming drain diffusion layers 46a (the steps of forming recesses). More specifically, the recess for the cell transistor is formed by the sidewall transfer processing technique so as to have at most the minimum dimensions at which the recess can be formed by lithography. In contrast, lower electrode 49a is formed by the lithography technique so as to have the minimum dimensions at which lower electrode 49a can be processed by lithography.

Furthermore, in the comparative example, lower electrode 49a is comparable in planar area to the magnetoresistive element MTJ and is smaller in planar area than the drain diffusion layer 46a.

As described above, the comparative example involves a reduced contact area between lower electrode 49a and the drain diffusion layer 46a, leading to an increased contact resistance between lower electrode 49a and the drain diffusion layer 46a. Furthermore, a variation in mask alignment as described above (a variation in processing method) causes a variation in contact resistance.

Additionally, as shown in FIG. 25 and FIG. 26, the source line contact 52a is formed in direct contact with the upper source of the source diffusion layer 46a' without interference of lower electrode 49a'. The source line contact 52a has a smaller planar area than the source diffusion layer 46a'.

Thus, the comparative example involves a reduced contact area between the source line contact 52a and the source diffusion layer 46a', leading to an increased contact resistance between the source line contact 52a and the source diffusion layer 46a'.

In contrast, the present embodiment, lower electrode 49a positioned between the magnetoresistive element MTJ and the drain diffusion layer 46a is shaped identically to the drain diffusion layer 46a in a plane so as to cover the drain diffusion layer 46a. This enables an increase in the contact area between the source line contact 52a and the source diffusion layer 46a', allowing a reduction in the contact resistance between lower electrode 49a and the drain diffusion layer 46a.

Furthermore, the present embodiment forms lower electrode 49a' between the source line contact 52a and source diffusion layer 46a'. Lower electrode 49a' is shaped identically to the source diffusion layer 46a' in a plane so as to cover the source diffusion layer 46a'. This enables an increase in the contact area between lower electrode 49a' and the source diffusion layer 46a', allowing a reduction in the contact resistance between lower electrode 49a' and the source diffusion layer 46a'. Additionally, not only the source line contact 52a, which has a small planar area, but also lower electrode 49a', which has a large planar area, are formed between the source diffusion layer 46a' and the source lines SL. This enables a reduction in electric resistance compared to the case where the source diffusion layer 46a' and the source lines SL are connected together only by the source line contact 52a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a cell transistor comprising a first gate electrode buried in a semiconductor substrate and a first diffusion layer and a second diffusion layer formed to sandwich the first gate electrode;
a first lower electrode formed on the first diffusion layer;
a magnetoresistive element formed on the first lower electrode to store data according to a change in a magnetization state and connected to a bit line located above;
a second lower electrode formed on the second diffusion layer; and
a first contact formed on the second lower electrode and connected to a source line located above,
wherein a contact area between the second lower electrode and the second diffusion layer is larger than a contact area between the first contact and the second lower electrode.

2. The device of claim 1, wherein the second lower electrode is formed to cover the second diffusion layer.

3. The device of claim 1, wherein a contact area between the first lower electrode and the first diffusion layer is larger than a contact area between the magnetoresistive element and the first lower electrode.

4. The device of claim 3, wherein the first lower electrode is formed to cover the first diffusion layer.

5. The device of claim 1, further comprising a core circuit directly electrically connected to a cell array comprising the cell transistor, the first lower electrode, the magnetoresistive element, the second lower electrode, and the first contact,
wherein the core circuit comprises a first core transistor comprising a second gate electrode buried in the semiconductor substrate and a third diffusion layer and a fourth diffusion layer formed to sandwich the second gate electrode.

6. The device of claim 5, wherein the core circuit comprises:
a second core transistor comprising the second gate electrode and a fifth diffusion layer and a sixth diffusion layer which are adjacent to the third diffusion layer and the fourth diffusion layer, respectively, via an isolation area and which are formed so as to sandwich the second gate electrode;
a third lower electrode formed to extend over the third diffusion layer, the isolation area, and the fifth diffusion layer; and
a second contact and a third contact both formed on the third lower electrode, the second contact being connected to a first interconnect located above, the third contact being connected to a second interconnect located above.

7. The device of claim 5, further comprising a peripheral circuit electrically connected to the cell array via the core circuit,
wherein the peripheral circuit comprises a first peripheral transistor comprising a third gate electrode formed on the semiconductor substrate and a fifth diffusion layer and a sixth diffusion layer formed in a surface of the semiconductor substrate so as to sandwich a channel below the third gate electrode.

8. The device of claim 1, further comprising:
a first metallic layer formed between the first lower electrode and the first diffusion layer; and
a second metallic layer formed between the second lower electrode and the second diffusion layer.

9. The device of claim 8, wherein the first lower electrode and the second lower electrode contain TiN, and the first metallic layer and the second metallic layer contain Ti.

10. The device of claim 1, further comprising:
a first silicide layer formed between the first lower electrode and the first diffusion layer; and
a second silicide layer formed between the second lower electrode and the second diffusion layer.

11. The device of claim 10, wherein the first lower electrode and the second lower electrode contain TiN, and the first silicide layer and the second silicide layer contain TiSi.

12. The device of claim 1, wherein a lower surface of the magnetoresistive element contacts a part of an upper surface of the first lower electrode.

13. A semiconductor memory device comprising:
a cell array including a magnetoresistive element storing data according to a change in a magnetization state; and
a core circuit directly electrically connected to the cell array,
wherein the core circuit comprises:
a first core transistor comprising a first gate electrode buried in a semiconductor substrate and a first diffusion layer and a second diffusion layer formed to sandwich the first gate electrode;
a second core transistor comprising the first gate electrode and a third diffusion layer and a fourth diffusion layer which are adjacent to the third diffusion layer and the fourth diffusion layer, respectively, via an isolation area and which are formed so as to sandwich the gate electrode;
a first lower electrode formed to extend over the first diffusion layer, the isolation area, and the third diffusion layer; and
a first contact and a second contact both formed on the first lower electrode, the first contact being connected to a first interconnect located above, the second contact being connected to a second interconnect located above.

14. The device of claim 13, wherein a part of the first contact is formed in contact with the first diffusion layer.

15. The device of claim 13, wherein the cell array comprises:
a cell transistor comprising a second gate electrode buried in the semiconductor substrate and a fourth diffusion layer and a fifth diffusion layer formed to sandwich the second gate electrode;
a second lower electrode formed on the fourth diffusion layer; and
a magnetoresistive element formed on the second lower electrode and connected to a bit line located above, and
the second lower electrode has a larger planar area than the magnetoresistive element.

16. The device of claim 13, further comprising a peripheral circuit electrically connected to the cell array via the core circuit,
wherein the peripheral circuit comprises a first peripheral transistor comprising a second gate electrode formed on the semiconductor substrate and a fifth diffusion layer and a sixth diffusion layer formed in a surface of the semiconductor substrate so as to sandwich a channel below the second gate electrode.

17. A semiconductor memory device comprising:
a cell transistor comprising a gate electrode buried in a semiconductor substrate and a first diffusion layer and a second diffusion layer formed to sandwich the gate electrode;

a first lower electrode formed on the first diffusion layer; and a magnetoresistive element formed on the first lower electrode to store data according to a change in a magnetization state and connected to a bit line located above, wherein a contact area between the first lower electrode and the first diffusion layer is larger than a contact area between the magnetoresistive element and the first lower electrode.

18. The device of claim 17, wherein the first lower electrode is formed to cover the first diffusion layer.

19. The device of claim 17, further comprising:
a first metallic layer formed between the first lower electrode and the first diffusion layer; and
a second metallic layer formed between the second lower electrode and the second diffusion layer.

20. The device of claim 17, further comprising:
a first silicide layer formed between the first lower electrode and the first diffusion layer; and
a second silicide layer formed between the second lower electrode and the second diffusion layer.

* * * * *